US012578359B2

(12) United States Patent
Bell et al.

(10) Patent No.: US 12,578,359 B2
(45) Date of Patent: Mar. 17, 2026

(54) WIRELESS HARNESS AUTOMATED MEASUREMENT SYSTEMS AND METHODS

(71) Applicant: Lockheed Martin Corporation, Bethesda, MD (US)

(72) Inventors: Kevin Bell, Vestal, NY (US); Gerald K. Mletzko, Jr., Pine City, NY (US); John Foster Braddy, Cumming, GA (US); John Daniel Semmens, Sandy Springs, GA (US); Samuel Jasper Franklin, Marietta, GA (US); Gibson Richard Garner, Marietta, GA (US)

(73) Assignee: Lockheed Martin Corporation, Bethesda, MD (US)

( * ) Notice: Subject to any disclaimer, the term of this patent is extended or adjusted under 35 U.S.C. 154(b) by 200 days.

(21) Appl. No.: 18/468,309

(22) Filed: Sep. 15, 2023

(65) Prior Publication Data

US 2025/0093382 A1     Mar. 20, 2025

(51) Int. Cl.
| | |
|---|---|
| *G01R 31/50* | (2020.01) |
| *G01R 1/02* | (2006.01) |
| *G01R 1/067* | (2006.01) |
| *G01R 31/00* | (2006.01) |

(52) U.S. Cl.
CPC ............ *G01R 1/067* (2013.01); *G01R 1/025* (2013.01); *G01R 31/005* (2013.01); *G01R 31/50* (2020.01)

(58) Field of Classification Search
CPC ....... G01R 1/067; G01R 1/025; G01R 31/005
See application file for complete search history.

(56) References Cited

U.S. PATENT DOCUMENTS

| | | |
|---|---|---|
| 5,072,185 A | 12/1991 | Rockwell |
| 5,852,796 A | 12/1998 | Stepanenko, Jr. |
| 6,222,374 B1 | 4/2001 | Shoemaker |
| 6,718,284 B2 | 4/2004 | Smith et al. |

(Continued)

FOREIGN PATENT DOCUMENTS

| | | |
|---|---|---|
| CN | 102681539 A | 9/2012 |
| CN | 203133218 U | 8/2013 |

(Continued)

OTHER PUBLICATIONS

Extended European Search Report corresponding to European Patent Application No. 24198525.8, Jan. 30, 2025, 7 pages.

(Continued)

*Primary Examiner* — Dominic E Hawkins
(74) *Attorney, Agent, or Firm* — Baker Botts L.L.P.

(57) ABSTRACT

According to some embodiments, a system includes a computer system and a plurality of wireless test modules. Each wireless test module includes a wireless transceiver and physically couples to an electrical wiring harness. The computer system sends test instructions to the plurality of wireless test modules according to an automated test plan. Each wireless test module wirelessly receives one or more of the plurality of test instructions from the computer system using the wireless transceiver and performs one or more tests on the electrical wiring harness according to received one or more test instructions from the computer system. Each wireless test module wirelessly communicates test results to the computer system using the wireless transceiver.

18 Claims, 27 Drawing Sheets

(56) References Cited

U.S. PATENT DOCUMENTS

| | | | | |
|---|---|---|---|---|
| 7,881,887 B2 * | 2/2011 | Kinahan | | G01R 31/58 |
| | | | | 702/123 |
| 8,373,383 B2 | 2/2013 | Dandekar et al. | | |
| 8,547,108 B2 | 10/2013 | Lussier | | |
| 8,912,800 B2 | 12/2014 | Gervais | | |
| 8,934,254 B2 | 1/2015 | Petrick et al. | | |
| 9,166,417 B2 | 10/2015 | Muramatsu et al. | | |
| 9,250,283 B2 | 2/2016 | Johnson et al. | | |
| 9,664,722 B2 | 5/2017 | Hotz Ordono et al. | | |
| 9,810,732 B2 | 11/2017 | Lussier | | |
| 9,812,892 B2 | 11/2017 | Miller et al. | | |
| 10,088,501 B2 | 10/2018 | Lussier | | |
| 10,170,920 B2 | 1/2019 | Robustelli et al. | | |
| 10,587,149 B2 | 3/2020 | Wikstrand | | |
| 10,697,999 B2 | 6/2020 | Lussier | | |
| 10,989,737 B2 | 4/2021 | Lussier | | |
| 10,996,286 B2 | 5/2021 | Schmier, II et al. | | |
| 11,271,427 B2 | 3/2022 | Miller et al. | | |
| 2011/0282607 A1 | 11/2011 | Tunnell | | |
| 2015/0293163 A1 | 10/2015 | Lebreton et al. | | |
| 2017/0264112 A1 | 9/2017 | Tandai et al. | | |
| 2018/0017608 A1 | 1/2018 | Nithyanandan et al. | | |
| 2019/0299942 A1 | 10/2019 | Shih et al. | | |
| 2020/0064387 A1 | 2/2020 | Hulsen et al. | | |
| 2020/0174058 A1 * | 6/2020 | Schmier, II | | G01R 31/69 |
| 2021/0218288 A1 | 7/2021 | Lu et al. | | |
| 2021/0274649 A1 * | 9/2021 | Szelest | | H01R 12/75 |
| 2021/0305831 A1 | 9/2021 | Wan | | |

FOREIGN PATENT DOCUMENTS

| | | | |
|---|---|---|---|
| CN | 103499967 A | 1/2014 |
| CN | 104615444 A | 5/2015 |
| CN | 104917258 A | 9/2015 |
| CN | 104953685 A | 9/2015 |
| CN | 109470974 A | 9/2015 |
| CN | 204706933 U | 10/2015 |
| CN | 105425099 A | 3/2016 |
| CN | 205657446 U | 10/2016 |
| CN | 106646082 A | 5/2017 |
| CN | 106855600 A | 6/2017 |
| CN | 107367373 A | 11/2017 |
| CN | 108767957 A | 11/2018 |
| CN | 110829614 A | 2/2020 |
| CN | 108828362 B | 9/2020 |
| CN | 111948427 A | 11/2020 |
| CN | 112698244 A | 4/2021 |
| CN | 212908116 U | 4/2021 |
| CN | 213069014 U | 4/2021 |
| CN | 214045626 U | 8/2021 |
| CN | 214069675 U | 8/2021 |
| CN | 111645617 B | 11/2021 |
| CN | 114122803 B | 8/2022 |
| EP | 0902521 B1 | 12/2008 |
| JP | 2003161754 A * | 6/2003 |
| KR | 100310971 B1 | 10/2001 |
| KR | 100335357 B1 | 5/2002 |
| KR | 200447162 Y1 | 12/2009 |
| KR | 101378427 B1 | 3/2014 |
| KR | 20180001950 U | 6/2018 |
| KR | 102133155 B1 | 7/2020 |
| KR | 1020210107374 A | 9/2021 |
| WO | 2013076087 A1 | 5/2013 |

OTHER PUBLICATIONS

Bao, Gui-Hao et al, "The Design of Aircraft Wiring Harness Detection System Based on Wireless Network Communication", 2016 International Conference on Information System and Artificial Intelligence (ISAI), IEEE, Jun. 24, 2016 (Jun. 24, 2016), pp. 543-546, XP033042805, DOI: 10.1109/ISAI.2016.0121 [retrieved on Jan. 12, 2017].

* cited by examiner

802

802

802

1400

1206

1106

1204

1400

WIRELESS HARNESS AUTOMATED MEASUREMENT SYSTEMS AND METHODS

TECHNICAL FIELD

This disclosure relates in general to testing of electrical wiring harnesses, and more particularly to wireless harness automated measurement systems and methods.

BACKGROUND

Electrical wiring harnesses are utilized in many different industries and vehicles. For example, large and complex electrical wiring harnesses with numerous electrical wires and connectors are utilized by the aerospace industry in the production of aircraft. As another example, electrical wiring harnesses are utilized by the automobile industry in the production of automobiles. Electrical wiring harnesses for vehicles such as aircraft and automobiles must typically be rigorously and thoroughly tested in order to ensure that there are no defects in connectors or electrical wires of the electrical wiring harness. For example, electrical wiring harnesses are tested to ensure there are no shorted wires, no swapped connector pins, no damaged wires, and the like.

SUMMARY OF THE DISCLOSURE

According to some embodiments, a system includes a computer system and a plurality of wireless test modules. Each wireless test module includes a wireless transceiver and is operable to physically couple to an electrical wiring harness. The computer system is operable to send test instructions to the plurality of wireless test modules according to an automated test plan. Each wireless test module is operable to wirelessly receive one or more of the plurality of test instructions from the computer system using the wireless transceiver and perform one or more tests on the electrical wiring harness according to received one or more test instructions from the computer system. Each wireless test module is further operable to wirelessly communicate test results to the computer system using the wireless transceiver.

According to some embodiments, a system includes a computer system and a wireless test module. The wireless test module is operable to physically couple to an electrical wiring harness. The wireless test module includes a wireless transceiver. The computer system is operable to send a plurality of test instructions to the wireless test module according to an automated test plan. The wireless test module is operable to wirelessly receive one or more of the plurality of test instructions from the computer system using the wireless transceiver and perform one or more tests on the electrical wiring harness according to the received one or more test instructions from the computer system. The wireless test module is further operable to wirelessly communicate test results to the computer system using the wireless transceiver.

According to some embodiments, a system includes hot-swap connectors for connecting a chassis of a wireless test module to a variable front end of the wireless test module. The variable front end of the wireless test module is operable to mate to an aircraft connector. The hot-swap connectors include a WTM side hot-swap connector and a front end side hot-swap connector located between the chassis of the wireless test module and the variable front end of the wireless test module. The WTM side hot-swap connector is operable to mate to a front end side hot-swap connector to connect the chassis of the wireless test module to the variable front end of the wireless test module. The WTM side hot-swap connector includes a female connector, an alignment peg configured to couple to the variable front end of the wireless test module, a slip ring configured to secure the wireless test module in place, and an electrically erasable programmable read-only memory (EEPROM) read/write wire integrated on a circuit board operable to read/write data of the aircraft connector. The front end side hot-swap connector includes a male connector, an alignment peg configured to couple to the chassis of the wireless test module, a thread configured to couple to a slip ring of a WTM side hot-swap connector, and an EEPROM integrated on a circuit board operable to store data of the aircraft connector.

According to some embodiments, the WTM side hot-swap connector is further operable to attach the variable front end of the wireless test module to the chassis of the wireless test module. The WTM side hot-swap connector is further operable to detach the variable front end of the wireless test module from the chassis of the wireless test module. The WTM side hot-swap connector is further operable to transfer the data to the wireless test module when the chassis of the wireless test module and the variable front end of the wireless test module mate. The WTM side hot-swap connector is a universal connector located at an end of the chassis of the wireless test module that is attached to a front end side hot-swap connector located at an end of the variable front end of the wireless test module. The wireless test module is further operable to wirelessly communicate, using a wireless transceiver, with a computer system to transfer the data stored on an EEPROM associated with the EEPROM read/write wire. The female connector includes a plurality of contacts in a range of 48 contacts to 128 contacts. The EEPROM read/write wire is configured to couple to the chassis of the wireless test module. The WTM side hot-swap connector further includes a jumper harness configured to couple to the wireless test module. The WTM side hot-swap connector is operable to swap to a different wireless test module with address information updated automatically in real time when the wireless test module malfunctions.

According to some embodiments, the front end side hot-swap connector is further operable to attach the variable front end of the wireless test module to the chassis of the wireless test module. The front end side hot-swap connector is further operable to detach the variable front end of the wireless test module from the chassis of the wireless test module. The front end side hot-swap connector is further operable to transfer the data to the wireless test module when the chassis of the wireless test module and the variable front end of the wireless test module mate. The front end side hot-swap connector is a universal connector located at an end of the variable front end of the wireless test module that is attached to a WTM side hot-swap connector located at an end of the chassis of wireless test module. The male connector includes a plurality of contacts in a range of 48 contact to 128 contacts. The front end side hot-swap connector further includes a plurality of connectors configured to couple to a wire jumper of the aircraft connector. The wireless test module is further operable to wirelessly communicate, using a wireless transceiver, with a computer system to transfer the data stored on the EEPROM. The data on the EEPROM is automatically incorporated into a testing software of the computer system without human data entry. The front end side hot-swap connector is further operable to swap to a different wireless test module with address information updated automatically in real time when the wireless test module malfunctions.

According to some embodiments, a system includes a battery pack module for a wireless test module. The battery pack module includes a wireless charging battery, a wireless battery pack holder operable to contain the wireless charging battery, an injected molded pogo pin holder comprising a plurality of pogo pins, and a wireless charging receiver operable to wirelessly charge the wireless charging battery. The injected molded pogo pin holder is coupled to the wireless battery pack holder using a set of screws. The injected molded pogo pin holder is operable to couple to the wireless test module. The battery pack module includes a steel retractable spring plunger comprising pull rings operable to hold the battery pack module together by attaching to the WTM using a second set of screws. The battery pack module includes a magnet attached to the wireless charging receiver operable to latch onto the WTM. The wireless charging receiver includes a 5 Volt (V) Qi standard wireless charging receiver comprising a magnetic plate compatible with the magnet. The wireless battery pack holder is a three-dimensional (3D) printed piece comprising a shape that allows the wireless battery pack holder to slip over an end of the WTM. The WTM is operable to perform one or more tests to validate an electrical wiring harness according to a plurality of test instructions received from a computer system. The one or more tests are selected from a plurality of tests comprising a continuity check, a voltage isolation check, a diode polarity check, and a resistance measurement check. The WTM is operable to communicate wirelessly with the computer system using WI-FI, Bluetooth, or Zigbee. The WTM includes an electrical connector that is operable to mate to a wiring harness connector of the electrical wiring harness.

According to some embodiments, a system includes a computer system and a computer-implemented method for operating a plurality of wireless test modules of a WHAMS. The computer-implemented method may use a computer server to access a plurality of electrical wiring harnesses, testing criteria, and the WHAMS. Each of the plurality of electrical wiring harnesses is connected to a respective endpoint of a wireless test module of the WHAMS. The computer-implemented method may generate a test plan for the plurality of electrical wiring harnesses based on the testing criteria and select a plurality of wireless test modules using the test plan and the WHAMS. In particular, the test plan includes a map of the plurality of electrical wiring harnesses, a plurality of harness connections associated with each of the plurality of wireless test modules, a hookup file, and a plurality of testing associated with the plurality of electrical wiring harnesses. The hookup file defines the plurality of wireless test modules assigned to the plurality of harness connections. For example, the test plan is generated using additional harness information of splices, passive equipment, and resignment of lose leads. As another example, the test plan is generated to check wires and unused pins in network configurations for each of the plurality of electrical wiring harnesses. The computer-implemented method may use the plurality of wireless test modules to perform one or more tests on the plurality of electrical wiring harnesses according to the plurality of test instructions. The one or more tests are selected from a plurality of tests comprising a continuity check, a voltage isolation check, a time domain reflectometer (TDR) test, a fiberoptic test, a diode polarity check, and a resistance measurement check. The computer-implemented method may use the plurality of WTMs to wirelessly communicate test results to the computer server for display. The computer-implemented method may implement a WTM board support package to apply a core operating application for the plurality of wireless test modules to perform the one or more tests on the plurality of electrical wiring harnesses according to the plurality of test instructions. The computer-implemented method may implement a custom power controller suite to manage a plurality of batteries for the plurality of wireless test modules. The computer-implemented method may implement a two-way testing approach to perform the one or more tests on the plurality of electrical wiring harnesses according to the plurality of test instructions. The computer-implemented method may evaluate a status of test results through color coded reporting by highlighting the test results using different colors. The computer-implemented method may wirelessly communicate with the plurality of wireless test modules to update a software package and one or more smart test adaptors associated with each of the plurality of wireless test modules using part numbers and pin configuration data of the one or more smart test adaptors.

According to some embodiments, a system includes a system and a computer-implemented method for operating a large module or a small module of a wireless test module. The system may include a wireless transceiver, an electrical wiring harness, and a wireless test module. The wireless test module is operable to physically couple to the electrical wiring harness. The wireless test module includes a chassis and a variable front end connected to the chassis using hot-swap connectors. The chassis includes a plurality of electrical relays designed for high voltage capable solid state multiplexing and a rechargeable battery. In particular, the chassis includes a central processing and memory block and a circuitry operable to determine measurements for manufacturing and debugging the electrical wiring harness. The variable front end includes an electrical connector operable to couple to a wiring harness connector of the electrical wiring harness. For example, the electrical connector supports up to a 128 pin connector. As another example, the electrical connector supports up to a 48 pin connector. The variable front end is a removable portion of the wireless test module. The variable front end includes a hot-swap interface to be rapidly interchangeable for different connectors.

According to some embodiments, the wireless test module is operable to wirelessly receive, using the wireless transceiver, a plurality of test instructions according to an automated test plan from a computer system. The wireless test module is further operable to perform, using the variable front end, one or more tests on the electrical wiring harness according to the plurality of test instructions. The one or more tests are selected from a plurality of tests comprising a continuity check, a voltage isolation check, a TDR test, a fiberoptic test, a diode polarity check, and a resistance measurement check. The wireless test module is further operable to wirelessly communicate, using the wireless transceiver, test results to the computer system. The wireless test module has a shape selected from a plurality of shapes comprising a prism shape, a pyramid shape, a cylindrical shape, and a sphere shape. The wireless test module is further operable to communicate wirelessly with the computer system using WI-FI, Bluetooth, or Zigbee. The wireless test module is further operable to apply pick-by-light functionality for initial hardware selection and harness hookup processes.

According to some embodiments, the wireless test module is further operable to apply an internal power source to one or more electrical wires of the electrical wiring harness in order to perform a test on the electrical wiring harness, wherein the internal power source is a high voltage source or a low voltage source. The wireless test module is further operable to replace an inoperable chassis with another available unit in case of malfunction. The wireless test module is further operable to generate a low voltage output of approximately 2.4 Volts (V) for a resistance/continuity test. The wireless test module is further operable to measure resistance with an accuracy of 10%+/−1 ohm for a resistance in a 1 ohm-50 ohm range. The wireless test module is further operable to measure resistance with an accuracy of 5%+/−1 ohm for a resistance in a 51 ohm-250 ohm range. The wireless test module is further operable to measure resistance with an accuracy of 10%+/−1 ohm for a resistance in a 251 ohm-1 M ohm range. The wireless test module is further operable to generate a voltage output within a range of 100V to 500V for high voltage testing. The wireless test module is further operable to measure resistance with an accuracy in a range of 6% and 10% using high voltages. The wireless test module is further operable to identify the variable front end.

According to some embodiments, a system includes an apparatus for charging a WHAMS. The apparatus includes a charging cart, a mobile aluminum frame, a plurality of light-emitting diode (LED) indicators, and a plurality of charging slots. The WHAMS include a plurality of wireless test modules. Each of the plurality of charging slots is associated with a respective wireless test module of the WHAMS. The charging cart is operable to charge the plurality of wireless test modules of the WHAMS. The mobile aluminum frame is operable to support the charging cart. The plurality of LED indicators are operable to identify a status of the plurality of the wireless test modules during setup and storage of the WHAMS.

According to some embodiments, the charging cart further includes a power supply operable to supply a power of 1500 Watts (W) to charge the plurality of wireless test modules in parallel. The charging cart is a double deck charging cart with a plurality of charging slots in a range of 150 charging slots to 200 charging slots. The charging cart is a single deck charging cart with a plurality of charging slots in a range of 50 charging slots to 100 charging slots. The charging cart is a mini charging cart with a plurality of charging slots in a range of 20 charge slots to 30 charging slots. The charging cart includes a foundation assembled by a plurality of sheets and pipes, the foundation including one or more decks welded on the charging cart to allocate the plurality of charging slots. The plurality of charging slots are keyed slots to receive the plurality of WTMs to ensure the plurality of WTMs are correctly placed. The charging cart is connected to the frame using bolts. Each of the plurality of LED indicators includes a red LED and a green LED. Each of the plurality of LED indicators turns red to indicate that an identified WTM associated with the respective LED indicator is currently charging. Each of the plurality of LED indicators turns green to indicate an identified WTM associated with the respective LED indicator to locate before testing. Each of the plurality of LED indicators turns off to indicate that an identified WTM associated with the respective LED indicator finishes charging. Each of the plurality of charging slots uses a 4 pogo pin layout to charge the plurality of wireless test modules. The 4 pogo pin layout includes a 5 Volt (V) pin, a ground pin, a green LED pin, and a red LED pin.

According to some embodiments, a system includes a computer system and a calibration fixture. The calibration fixture is operable to calibrate a wireless test module of a WHAMS. The wireless test module includes a plurality of field effect transistors (FETs). The plurality of FETs may be optically isolated MOFFETS. The calibration fixture includes a plurality of resistors. The calibration fixture is operable to measure a resistance calibration value by measuring a first resistance value and a second resistance value of the plurality of FETs in a plurality of internal measurement tests for the wireless test module. The calibration fixture is operable to perform a resistance accuracy test (RAT) using the plurality of resistors of the calibration fixture on the wireless test module. The RAT may select a resistor from the plurality of resistors of the calibration fixture and a test associated with the WTM, wherein the resistor is associated with a target resistor value. The RAT may measure, using the calibration fixture and the test, a plurality of calibration factors. The RAT may determine a measured resistor value using the plurality of calibration factors. The RAT may store the measured resistor value and the target resistor value in a database of the computer server. The plurality of FETs includes a high side FET having a high side resistance and a low side FET having a low side resistance. The test is selected from a plurality of tests comprising a continuity check, a voltage isolation check, a diode polarity check, and a resistance measurement check. The first resistance value of the FETs measures the high side resistance associated with the high side FET. The second resistance value of the FETs measures a summation of both the high side resistance associated with the high side FET and the low side resistance associated with the low side FET. The first resistance value is in a range of 80 ohms to 90 ohms and the second resistance value is in a range of 120 ohms to 140 ohms. The plurality of resistors have a plurality of resistor values ranging from 1 ohm to 50 Mohms. The plurality of calibration factors for a continuity test includes a high side calibration indicator on a source side, a high side calibration factor on a sink side, and an initial resistor value. The measured resistor value for the continuity test is determined by subtracting the high side calibration indicator on the source side and the high side calibration factor on the sink side from the initial resistor value. The calibration fixture is further operable to perform a plurality of RATs on the WTM using the plurality of resistors of the calibration fixture. The calibration fixture is further operable to store the plurality of calibration factors and RAT history associated with the RAT in the databased of the computer server. The calibration fixture is further operable to perform a controlled periodic calibration to the WHAMS to detect a potential mode of failure using resistance of the FETs drifting over a period of time.

Technical advantages of certain embodiments may include providing improved systems and methods for testing electrical wiring harnesses utilized in aircraft, automobile, or other vehicles and devices. The wireless harness automated measurement systems and methods of the present disclosure provide a unique combination of hardware flexibility and mobility for application in all phases of electrical wiring harness testing. Instead of the typical bulky testing cabinets with hard-wired adaptors, the disclosed embodiments utilize one or more wireless test modules that physically couple to an electrical wiring harness under test and then wirelessly transmit test results back to a central computer. This provides a wireless and scalable architecture that ensures the maximum utilization of the hardware. The wireless communication ability of the wireless test modules opens doors to electrical testing in environments that were previous difficult to access by hard-wired testing systems (e.g., by cabinet-style electrical relay box test systems with hard-wired test cable adaptors).

Furthermore, the minimalistic equipment requirements to begin testing lowers testing entry barriers and increase the efficiency of the system. The disclosed embodiments provide simplistic information input formats that guarantees fast and automated test plan creation with little or no manual tasks required by an operator. Other technical advantages will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the disclosed embodiments and their features and advantages, reference is now made to the following description, taken in conjunction with the accompanying drawings, in which.

DETAILED DESCRIPTION OF THE DISCLOSURE

Figure 1:
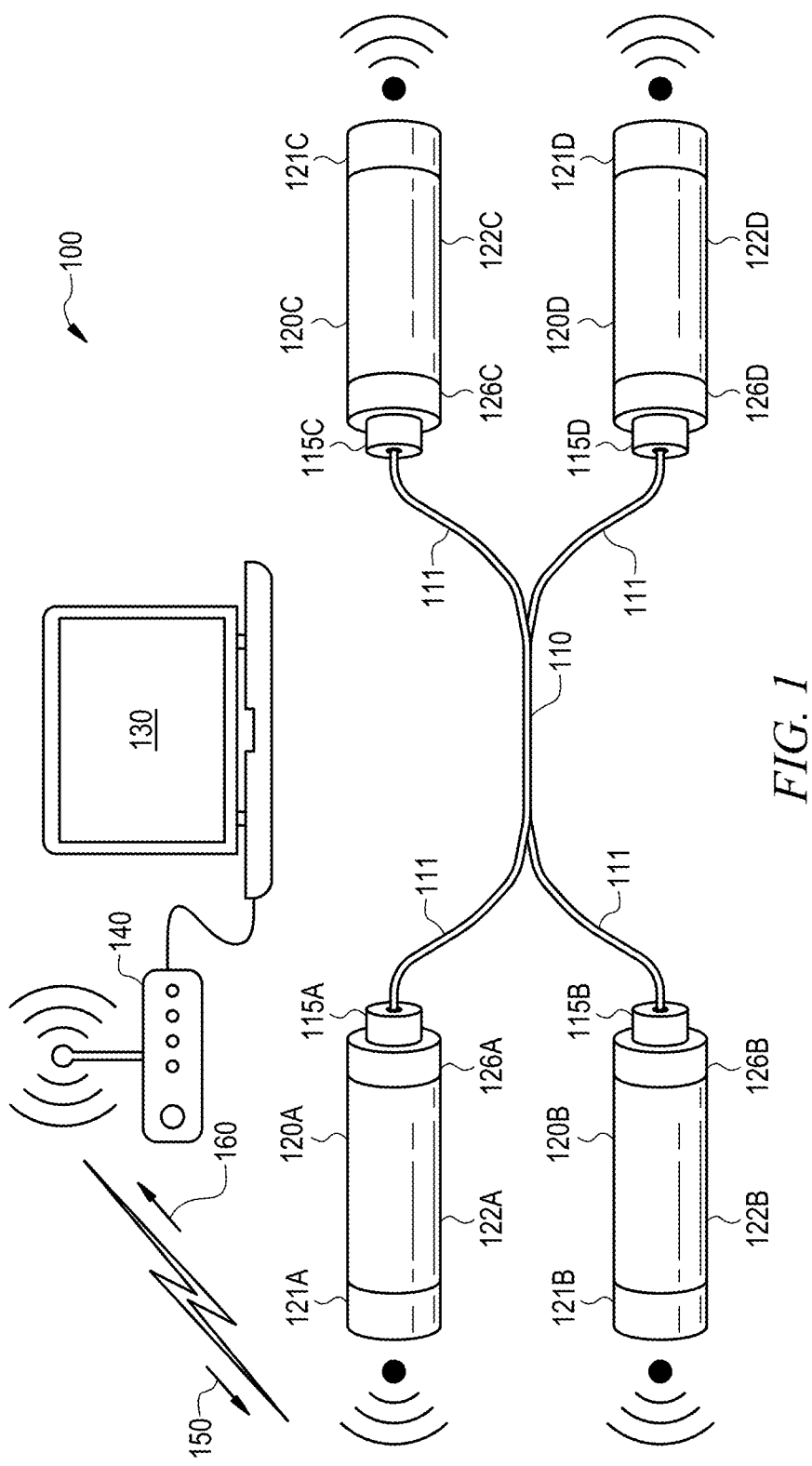
FIG. 1 illustrates a wireless harness automated measurement system, according to some embodiments.

Electrical wiring harnesses are utilized in many different industries and vehicles. For example, large and complex electrical wiring harnesses with numerous electrical wires and connectors are utilized by the aerospace industry in the production of aircraft. As another example, electrical wiring harnesses are utilized by the automobile industry in the production of automobiles. Electrical wiring harnesses for vehicles such as aircraft and automobiles must typically be rigorously and thoroughly tested in order to ensure that there are no defects in components of the electrical wiring harness such as connectors and electrical wires. For example, electrical wiring harnesses are tested to ensure there are no shorted wires, no swapped connector pins, no damaged wires, and the like.

Typically, electrical wiring harnesses are tested using a large cabinet-style electrical relay box with hard-wired interfacing test cable adaptors that physically couple to both the connectors of the electrical wiring harness under test and the electrical relay box. The electro-mechanical actuation occurs in the centralized cabinet, while the hard-wired cable adaptors act as extension cords for the unique mating connectors to reach the electrical wiring harness under test. Such systems, however, may present problems in certain situations. For example, it is inefficient to use cabinet-style test machines in harness testing, such as setup, testing, repair (harness and tool), and breakdown. Typical cabinet-style test machines are large, heavy, and relatively immobile, they rely on highly customized test cable adaptor sets, and are not able to be efficiently scaled to meet changing electrical testing needs. As another example, an operator usually spends hundreds of hours in using cabinet-style test machines in harness testing per aircraft, such as troubleshooting systems to verify quality of products in aerospace, defense, and transit/rail industry. As another example, typical cabinet-style test machines need to test various independent sets of test cables and appropriate fixturing for fabrication tooling in a wire harness formboard.

To address these and other problems with typical systems for testing electrical wiring harnesses, the present disclosure provides wireless harness automated measurement systems and methods. Certain disclosed embodiments utilize one or more wireless test modules (WTMs) that each physically and electrically couple to a connector of the electrical wiring harness under test. The one or more wireless test modules are utilized in a wireless harness automated measurement system (WHAMS) for a mobile test solution to validate electrical harnesses, while mitigating inefficiencies of traditional cable-based testing using the cabinet-style test machines. The wireless test modules send and receive electrical test signals through one or more wires of the electrical wiring harness and then, unlike current hard-wired solutions, wirelessly report test results back to a central computer systems such as a laptop. That is, each wireless test module is not physically connected to the central computer system but instead wirelessly communicates with the central computer system. This allows the wireless test modules to be carried to the location of the electrical wiring harness without having to worry about moving the central computing system or a bulky relay cabinet. This increases productivity and flexibility when testing the electrical wiring harnesses. In some embodiments, the wireless test modules are cylindrical in shape and are similar in size and shape to a typical flashlight. This small form factor enables a technician to easily carry multiple wireless test modules and install them on an electrical wiring harness under test that may be physically located away from the central computing system (e.g., in a next room or floor).

Each wireless test module includes two main pieces: a chassis and a front end. The chassis of the wireless test module houses electronics and components (e.g., batteries, relays, etc.) for performing electrical tests on an electrical wiring harness (e.g., continuity checks, voltage isolation checks, diode polarity checks, resistance measurement checks, etc.). The removable front end of the wireless test module contains a specific mating connector for connecting to a connector of the electrical wiring harness and is rapidly interchangeable with a common interface on the front of the wireless test module. The wireless test modules are interchangeable with one another and are not dedicated to any specific wiring harness or system. The configuration of the wireless harness automated measurement system allows for catalogues of front ends to be built for a variety of electrical connector needs while minimizing the number of wireless test modules needed for maximum hardware utilization. The hardware commonality of the wireless test module chassis also provides easy swapping in case of malfunction. If one wireless test module become inoperable, critical testing activity can continue without delay by simply replacing the inoperable wireless test module chassis with another available unit. As a result, test operators are able to complete testing of an electrical wiring harness without the requirement of test equipment troubleshooting or repair.

The wireless harness automated measurement systems and methods of the present disclosure provide a unique combination of hardware flexibility and mobility for application in all phases of electrical wiring harness testing. Certain disclosed embodiments provide a wireless and scalable architecture that ensures the maximum utilization of the hardware. The wireless communication ability of the wireless test modules opens doors to electrical testing in environments that were previous difficult to access by hardwired testing systems (e.g., by cabinet-style electrical relay box test systems with hard-wired test cable adaptors). Furthermore, the minimalistic equipment requirements to begin testing lowers testing entry barriers and increase the efficiency of the system. Certain disclosed embodiments provide simplistic information input formats that guarantees fast and automated test plan creation with little or no manual tasks required by an operator.

To facilitate a better understanding of the present disclosure, the following examples of certain embodiments are given. In no way should the following examples be read to limit or define the scope of the disclosure. Embodiments of the present disclosure and its advantages may be best understood by referring to the included FIGURES, where like numbers are used to indicate like and corresponding parts.

WHAMS Overall System

FIG. 1 illustrates a wireless harness automated measurement system 100, according to some embodiments. Wireless harness automated measurement system 100 includes an electrical wiring harness 110 under test, one or more wireless test modules 120 (e.g., 120A, 120B, 120C, and 120D), a central computer system 130, and a wireless interface 140. While a specific number of wireless test modules 120 are illustrated in FIG. 1, other embodiments may utilize any number of wireless test modules 120.

In general, wireless harness automated measurement system 100 utilizes one or more wireless test modules 120 to test the functionality of electrical wiring harness 110. Each wireless test module 120 has a variable front end 126 (e.g., 126A, 126B, 126C, and 126D) that includes at least one connector that physically and electrically couples to a wiring harness connector 115 (e.g., 115A, 115B, 115C, and 115D) of the electrical wiring harness 110 under test. Wireless test modules 120 send and receive electrical test signals through one or more electrical wires 111 of electrical wiring harness 110 in order to perform tests such as continuity checks (e.g., pins of wiring harness connector 115 are in the wrong locations, shorted pins in wiring harness connector 115, etc.), voltage isolation checks, diode polarity checks, and resistance measurement checks. Then, unlike typical solutions that are hard-wired to a bulky relay cabinet, wireless test modules 120 wirelessly report test results 160 back to central computer system 130 using a wireless transceiver 121 (e.g., 121A, 121B, 121C, and 121D). That is, each wireless test module 120 is not physically connected to central computer system 130 but instead wirelessly communicates with central computer system 130 using a wireless protocol such as Zigbee, Bluetooth, or WI-FI. The small form factor of wireless test modules 120, along with their ability to wirelessly communicate with central computer system 130, enables a technician to easily carry multiple wireless test modules 120 and coupled them to wiring harness connectors 115 on an electrical wiring harness 110 under test even when electrical wiring harness 110 is physically located away from central computer system 130.

Electrical wiring harness 110 is a bundle of electrical wires 111. Electrical wiring harness 110 includes one or more wiring harness connectors 115 that are coupled to one or more electrical wires 111. For example, electrical wiring harness 110 of FIG. 1 includes four wiring harness connectors 115: 115A-115D. Wiring harness connector 115 may be any appropriate electrical connector and may include any number of pins or electrical contacts. Examples of wiring harness connectors 115 include signal connectors, power connectors, and the like. Electrical wiring harness 110 may be installed in any device or vehicle such as an aircraft, automobile, watercraft, spacecraft, and the like. Wireless harness automated measurement system 100 may be utilized to test electrical wiring harness 110 either before or after it has been installed in its intended device, aircraft, or vehicle.

Each wireless test module 120 (120A-120D) is a portable test device that physically connects to a wiring harness connector 115 of electrical wiring harness 110. performs one or more electrical tests on electrical wiring harness 110 as instructed by central computer system 130, and/or wirelessly communicates test instructions 150 from the electrical tests back to central computer system 130. Existing test systems for electrical wiring harnesses include large, bulky relay cabinets with hard-wired test adaptors that connect to wiring harness connectors 115. Such systems are difficult to transport, are not easily adaptable, and are not easily scalable. However, by utilizing wireless test modules 120 that have a small form factor and are easily portable, wireless harness automated measurement system 100 may be utilized to test electrical wiring harness 110 that is located an extended distance away (e.g., in another room or floor). Furthermore, any number of wireless test modules 120 may be utilized by wireless harness automated measurement system 100 to test electrical wiring harness 110, thereby increasing the adaptability and scalability of wireless harness automated measurement system 100 over existing hard-wired test relay cabinets.

Each wireless test module 120 includes a wireless transceiver 121, a chassis 122 (e.g., 122A, 122B, 122C, and 122D), and a variable front end 126. Wireless transceiver 121 enables wireless test module 120 to wirelessly communicate with central computer system 130 (either directly or via wireless interface 140) using any appropriate wireless protocol (e.g., Zigbee, Bluetooth, WI-FI, and the like). Chassis 122 is the main body of wireless test module 120 and houses components such as batteries, relays, processors, memory, and the like. Variable front end 126 is a removable portion of wireless test module 120 that includes an electrical connector that is configured to mate to a wiring harness connector 115 of electrical wiring harness 110. For example, if wiring harness connector 115A is a typical three-prong male electrical plug, variable front end 126 may be include a three-prong female electrical plug. As another example, if wiring harness connector 115A is a male coaxial electrical connector, variable front end 126 may include a female coaxial electrical connector. More details about wireless test module 120 and its components are discussed in more detail below in reference to FIGS. 2-8C.

Central computer system 130 may be any appropriate computing system in any suitable physical form. As example and not by way of limitation, central computer system 130 may be an embedded computer system, a system-on-chip (SOC), a single-board computer system (SBC) (such as, for example, a computer-on-module (COM) or system-on-module (SOM)), a desktop computer system, a laptop or notebook computer system, a mainframe, a mesh of computer systems, a mobile telephone, a personal digital assistant (PDA), a server, a tablet computer system, an augmented/virtual reality device, or a combination of two or more of these. Where appropriate, central computer system 130 may include one or more computer systems; be unitary or distributed; span multiple locations; span multiple machines; span multiple data centers; or reside in a cloud, which may include one or more cloud components in one or more networks. Where appropriate, central computer system 130 may perform without substantial spatial or temporal limitation one or more steps of one or more methods described or illustrated herein. As an example and not by way of limitation, central computer system 130 may perform in real time or in batch mode one or more steps of one or more methods described or illustrated herein. Central computer system 130 may perform at different times or at different locations one or more steps of one or more methods described or illustrated herein, where appropriate. A particular example of a central computer system 130 is described in reference to FIG. 20.

Wireless interface 140 is any appropriate device that is able to provide wireless communications between central computer system 130 and wireless test modules 120. In some embodiments, wireless interface 140 is a separate device that is communicatively coupled to (e.g., either wired to, wirelessly coupled to, or physically plugged into) central computer system 130. In other embodiments, wireless interface 140 is internal to or incorporated within central computer system 130. In some embodiments, wireless interface 140 is a Zigbee transceiver module, a WI-FI router, or a Bluetooth transceiver.

Test instructions 150 are one or more signals, operations, commands, and the like that are wirelessly sent from central computer system 130 to wireless test module 120. Test instructions 150 are utilized by wireless test module 120 in order to perform one or more electrical tests on electrical wiring harness 110. The electrical tests may be, for example, a continuity check (e.g., pins of wiring harness connectors 115 are in the wrong location, pins of wiring harness connectors 115 are shorted, electrical wire 111 is damaged, etc.), a voltage isolation check, a diode polarity check, a resistance measurement check, and the like. In some embodiments, test instructions 150 are determined by central computer system 130 according to a test plan for electrical wiring harness 110. An example of test instructions 150 is described in reference to FIGS. 18A and 18B.

Test results 160 are one or more signals, values, pass/fail indicators, and the like that are wirelessly sent from wireless test module 120 to central computer system 130 (either directly or via wireless interface 140). Test results 160 are results from one or more electrical test performed by wireless test module 120 on electrical wiring harness 110. Test results 160 also include status signals and other meta data which is not directly related to harness test results. An example of test results 160 is described in reference to FIG. 18A.

Figure 2A:
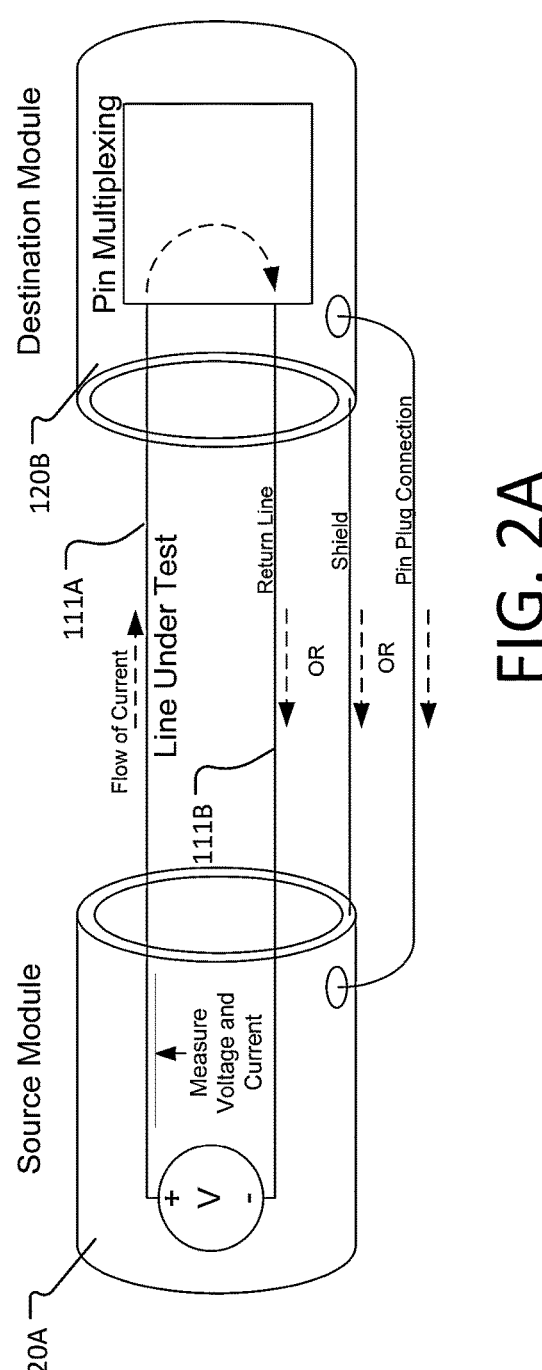
FIGS. 2A-2B illustrate testing of an electrical wiring harness by the wireless harness automated measurement system of FIG. 1, according to some embodiments.
Figure 2B:
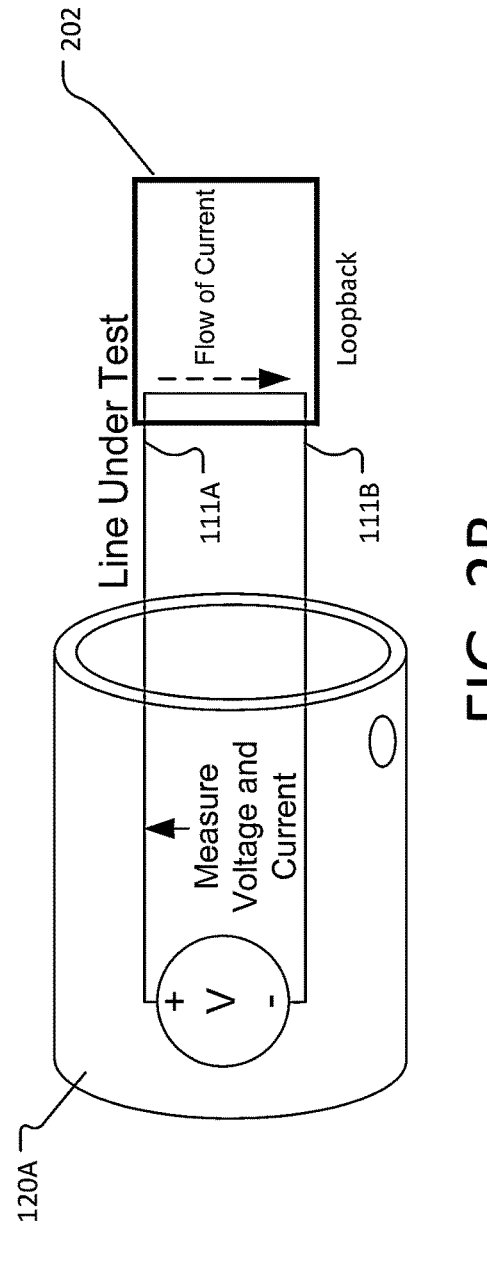

FIGS. 2A-2B illustrate various examples of testing an electrical wiring harness 110 by wireless harness automated measurement system 100, according to some embodiments. In FIG. 2A, two wireless test modules 120 are utilized to perform testing on electrical wiring harness 110: a source wireless test module 120A and a destination wireless test module 120B. In this example, source wireless test module 120A is physically coupled to a first wiring harness connector 115A and destination wireless test module 120B is physically coupled to a second wiring harness connector 115B. Two electrical wires 111 are utilized during testing in this scenario: a first electrical wire 111A and a second electrical wire 111B. Second electrical wire 111B is used as a return line in this example. Both electrical wires 111A and 111B are physically and electrically coupled to both source wireless test module 120A and destination wireless test module 120B via wiring harness connectors (e.g., wireless harness connectors 115A and 115B of FIG. 1). Source wireless test module 120A introduces a flow of electrical current on first electrical wire 111A, and destination wireless test module 120B internally connects first electrical wire 111A to second electrical wire 111B using, for example, electrical relays. Source wireless test module 120A may then measure voltage and current across first electrical wire 111A and second electrical wire 111B in order to perform various electrical tests as described herein. Destination wireless test module 120B also measures current and voltage to ensure electrical current actually reaches Destination wireless test module 120B. Destination wireless test module 120B includes a pin multiplexing component, such as a high voltage capable solid state multiplexing block 616, which is configured to provide connections by transmitting a signal over one or more channels in a variety of switching and digital control applications.

In other embodiments of the example of FIG. 2A, options other than second electrical wire 111B may be utilized for an electrical return path or ground. For example, an electrical shield within electrical wiring harness 110 may be utilized for the electrical return path or ground. As another example, an electrical jumper (e.g., a wire) may be physically connected to both source wireless test module 120A and destination wireless test module 120B and used as the electrical return path or ground.

In FIG. 2B, a single wireless test module 120A is utilized to perform testing on electrical wiring harness 110. In this example, wireless test module 120A is physically coupled to a first wiring harness connector (e.g., wiring harness connector 115A of FIG. 1) and a loopback connector (or other similar device) 202 is physically coupled to a second wiring harness connector (e.g., wiring harness connector 115B of FIG. 1). Two electrical wires 111 are utilized during testing in this scenario: a first electrical wire 111A and a second electrical wire 111B. Second electrical wire 111B is used as a return line in this example. Both electrical wires 111A and 111B are physically and electrically coupled to wireless test module 120A and are coupled to each other using the loopback device. Wireless test module 120A introduces a flow of electrical current on first electrical wire 111A, which is returned to wireless test module 120A on second electrical wire 111B. Wireless test module 120A may then measure voltage and current across first electrical wire 111A and second electrical wire 111B in order to perform various electrical tests as described herein.

In operation, and in reference to FIGS. 1, 2A, and 2B, wireless harness automated measurement system 100 utilizes central computer system 130 and one or more wireless test modules 120 to test electrical wiring harness 110. First, one or more wireless test modules 120 are physically connected to one or more wiring harness connectors 115 of electrical wiring harness 110. For example, source wireless test module 120A is physically coupled to first wiring harness connector 115A and destination wireless test module 120B is physically coupled to second wiring harness connector 115B as illustrated in FIG. 2A. As another example, wireless test module 120A is physically coupled to first wiring harness connector 115A and a loopback connector (or other similar device) 202 is physically coupled to second wiring harness connector 115B as illustrated in FIG. 2B. Next, central computer system 130 sends test instructions 150 to one or more wireless test modules 120 according to an automated test plan. More details and examples of an automated test plan used for testing electrical wiring harness 110 are discussed in more detail below. In some embodiments, test instructions 150 are sent to the one or more wireless test modules 120 using wireless interface 140. The test instructions 150 may be sent using any appropriate wireless protocol such as WI-FI, Bluetooth, or Zigbee.

After receiving test instructions 150 using wireless transceiver 121, wireless test module 120 performs one or more tests on electrical wiring harness 110 according to received test instructions 150 from central computer system 130. The electrical tests may be, for example, a continuity check (e.g., pins of wiring harness connectors 115 are in the wrong location, pins of wiring harness connectors 115 are shorted, electrical wire 111 is damaged, etc.), a voltage isolation check, a diode polarity check, a resistance measurement check, and the like. For example, wireless test module 120 may activate/deactivate one or more internal electrical relays and apply electrical current from an internal power source to one or more electrical wires 111 of electrical wiring harness 110 in order to perform a continuity check on electrical wiring harness 110. Each wireless test module 120 is able to vary a voltage and an electrical current on one or more connected electrical wires 111 according to the received test instructions 150. After performing the one or more tests on electrical wiring harness 110 according to received test instructions 150 from central computer system 130, wireless test module 120 wirelessly transmits test results 160 back to central computer system 130 (either directly or via wireless interface 140). Once test results 160 are received by central computer system 130, central computer system 130 may display test results 160 received from one or more wireless test modules 120 on an electronic display.

WHAMS Wireless Test Modules

In some embodiments, a wireless test module is the primary electrical testing hardware of the WHAMS. The wireless test module is a cylindrical, wirelessly enabled communication and testing node capable of conducting a variety of electrical checkouts by mating with the discrete electrical connectors of an aircraft or other electrical harness. The wireless test module may communicate with a radio transceiver powered by the central computer system 130. As a result, the central computer system 130 sends various types of commands to the wireless test module for test execution and reporting. The wireless test module is capable of operating on its own or within scalable networks of a plurality of wireless test modules for use on large harness assemblies.

Figure 3:
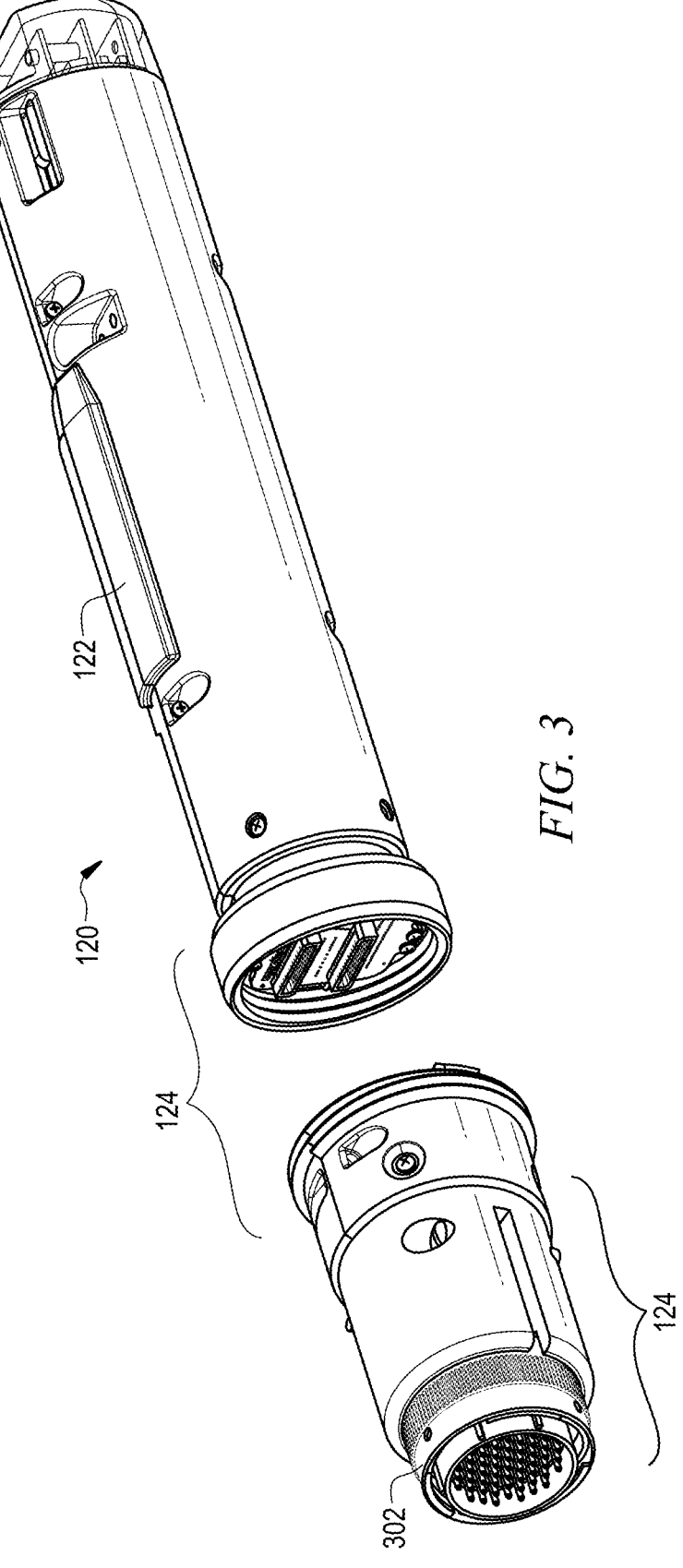
FIG. 3 illustrates a wireless test module that may be utilized by the wireless harness automated measurement system of FIG. 1, according to some embodiments.

FIG. 3 illustrates a wireless test module 120 that may be utilized by the wireless harness automated measurement system of FIG. 1, according to some embodiments. Each wireless test module 120 includes a wireless transceiver 121 (shown in FIG. 1), a chassis 122, and a variable front end 126. Wireless test module 120 is the primary electrical testing hardware of WHAMS. In some embodiments, traditional electrical harness testing hardware includes one or more large charge cabinets and extended cables with unique test adaptors at the end. The one or more charge cabinets may be configured to house hundreds of relays and other electrical components used to conduct different test types needed for functional electrical harness verification. In particular, individual charge cabinets may test thousands of test points and can be expanded by connecting multiple charge cabinets together. However, the one or more charge cabinets are configured to be scalable in large increments of test points. For example, the one or more charge cabinets are configured to be deployable for a harness configuration requiring less than or equal to a predetermined number of test points. As a result, it is difficult to optimize the cabinet configurations of the one or more charge cabinets to reduce cost, especially for small electrical harness assemblies comprising low pin count connectors with high variety. Usually, the one or more charge cabinets include a plurality of connectors with various pin counts, types, and units for a majority of the work being completed.

In some embodiments, the one or more large charge cabinets use a panel of generic connector interfaces for a plurality of test adaptor cables to plug into. The plurality of test adaptor cables are double ended and unique in length, increasing weight and fabrication cost of the traditional electrical harness testing hardware. Thus, it is difficult to transport and deploy the traditional electrical harness testing hardware in an agile manor for multi-build environment usage.

In some embodiments, wireless test module 120 is configured to use smaller charge cabinets. In particular, wireless test module 120 has mobile and rapidly configurable cabinet configurations which allow wireless test module 120 to be contained in a tight form factor for full and closed loop wireless capability for electrical harness testing. Wireless test module 120 is battery powered and operates independently from other wireless test modules based on a discrete architecture. Thus, wireless test module 120 may perform one or more tests which are no longer tethered to an immediate power source or cabled test adaptors. As a result, wireless test module 120 may provide a more efficient performance for testing a variety of harness sizes and decrease the necessary non-recurring engineering (NRE) to stand up new test adaptors.

In some embodiments, wireless test module 120 is a cylindrical, wirelessly enabled communication and testing node. Chassis 122 may be a circuit card assembly (CCA) chassis which houses a plurality of electronical components. Wireless test module 120 may replace an inoperable chassis 122 with another available unit in case of malfunction. In some embodiments, the variable front end 126 includes an electrical connector 302 (and back shell if applicable), a plastic adapter (such as hot-swap interface 124, which connects electrical connector 302 to chassis 122), and a wire harness (e.g., jumper harness 708 of FIG. 7A) which makes the connections from electrical connector 302 to chassis 122. Variable front end 126 is a removable portion of wireless test module 120. Wireless test module 120 may be configured to automatically identify the test adaptor, such as variable front end 126, which is connected to wireless test module 120. Variable front end 126 may use electrical connector 302 to couple to a wiring harness connector of an electrical wiring harness. Thus, wireless test module 120 may be configured to physically couple to an electrical wiring harness for performing one or more electrical tests on the electrical wiring harness (e.g., continuity checks, voltage isolation checks, diode polarity checks, resistance measurement checks, etc.). In particular, wireless test module 120 may be configured to use wireless transceiver 121 to wirelessly receive a plurality of test instructions (e.g., test instructions 150 of FIG. 1) according to an automated test plan from the central computer system (e.g., central computer system 130 of FIG. 1). Wireless test module 120 is configured to use variable front end 126 to perform one or more tests on the electrical wiring harness according to the plurality of test instructions an in accordance with an automated test plan from the central computer system. Wireless test module 120 is configured to use wireless transceiver 121 to wirelessly communicate test results to the central computer system.

Figure 4:
FIG. 4 illustrates an exploded view of the wireless test module of FIG. 3, according to some embodiments.

FIG. 4 illustrates an exploded view of wireless test module 120 of FIG. 3, according to some embodiments. The wireless test module 120 is a common, replicated piece of module for easy interchanging of units for easy of repair and elimination of system downtime. Variable front end 126 (shown in FIG. 1) may be customized while chassis 122 remains consistent. For example, variable front end 126 may include a front-end side hot-swap connector 404 that is rapidly interchangeable for different connectors. Chassis 122 may be configured to house a plurality of electronical components, which allows wireless test module 120 to communicate wirelessly with the central computer system (e.g., central computer system 130 of FIG. 1) using WI-FI, Bluetooth, or Zigbee. Wireless test module 120 may use a Zigbee communications protocol to communicate with a test software and the wireless transceiver (e.g., wireless transceiver 121 of FIG. 1). Thus, wireless test module 120 provides a mobile and modular electric harness tester which does not use cabled test adaptors to communicate with the central computer system.

Figure 5:
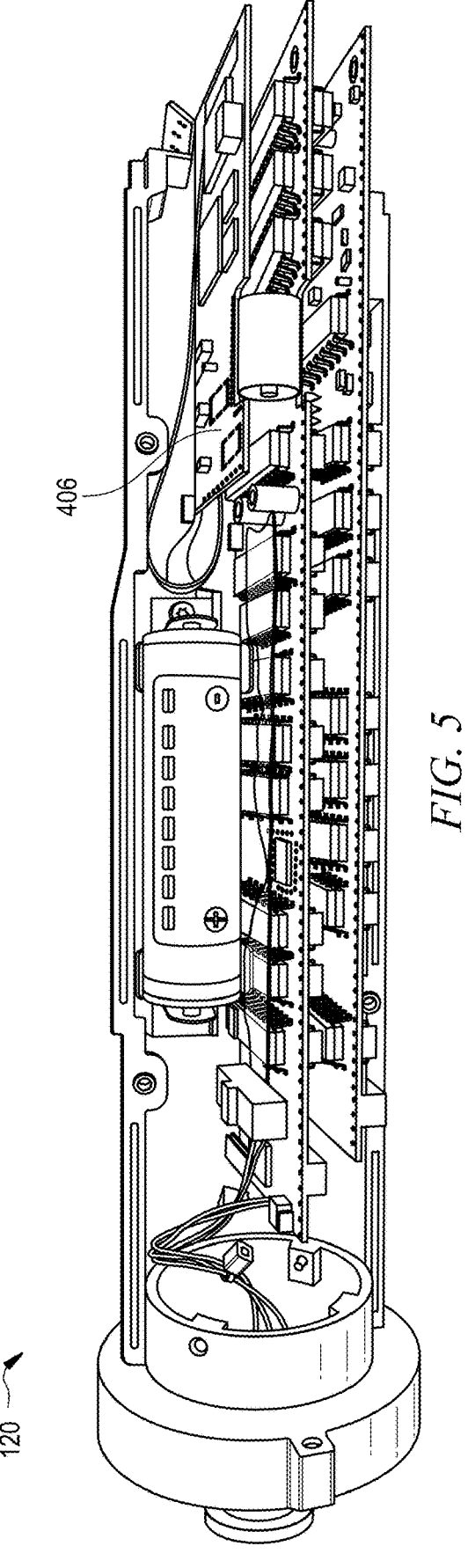
FIG. 5 illustrates an internal view of the wireless test module of FIG. 3, according to some embodiments.

FIG. 5 illustrates an internal view of wireless test module 120 of FIG. 3, according to some embodiments. Wireless test module 120 may include a large variety of mating electrical connectors 406. For example, wireless test module 120 may support up to 128 pin electrical connectors 406. As another example, wireless test module 120 may support up to 48 pin electrical connectors 406. Electrical connectors 406 may be integrated into wireless test module 120 to couple to a wiring harness connector of the electrical wiring harness.

Figure 6:
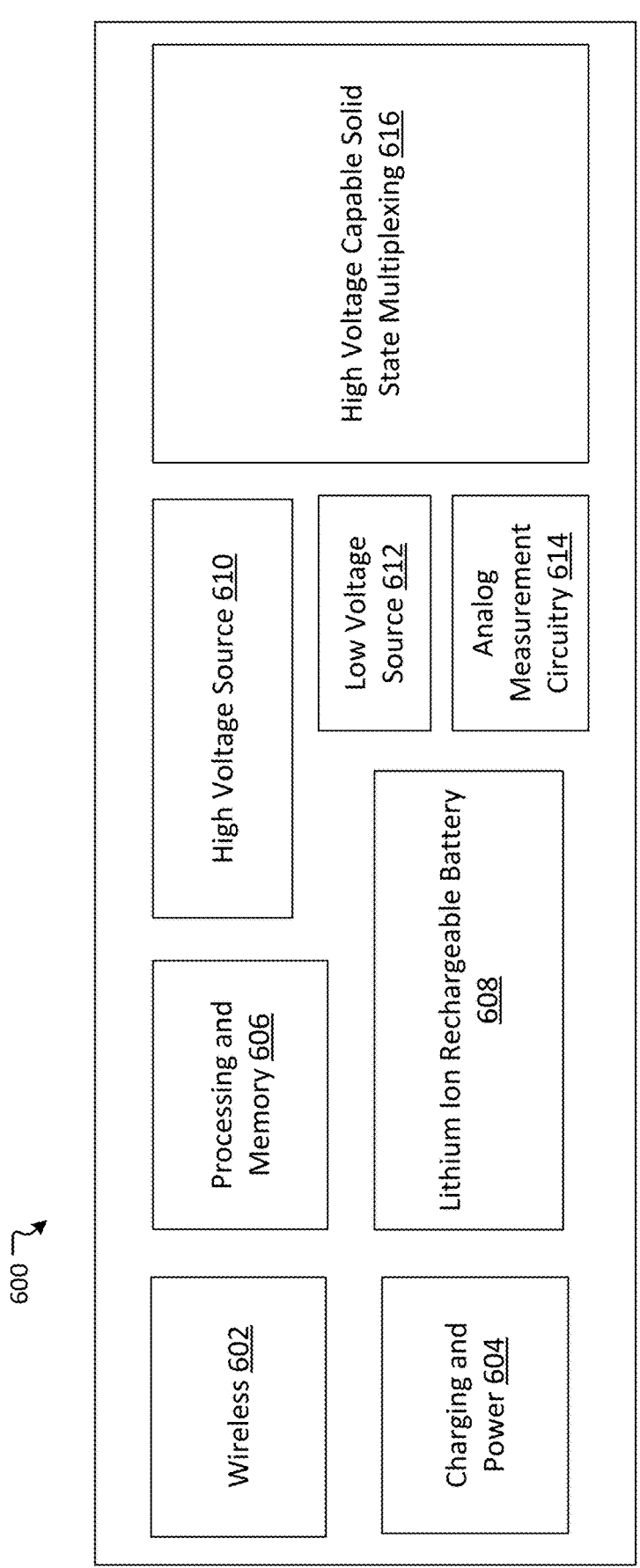
FIG. 6 illustrates a functional block diagram of the wireless test module of FIG. 3, according to some embodiments.

FIG. 6 illustrates a functional block diagram 600 of wireless test module 120 of FIG. 3, according to some embodiments. The wireless test module includes a plurality of electronical components, such as a wireless block 602, a charging and power block 604, a central processing and memory block 606, a lithium-ion rechargeable battery 608, a high voltage source 610, a low voltage source 612, an analog measurement circuitry 614, and a high voltage capable solid state multiplexing block 616. High voltage capable solid state multiplexing block 616 is connected to the variable front end (e.g., variable front end 126 of FIG. 3) of the wireless test module. In certain embodiments, central processing and memory block 606 of the wireless test module is combined with circuitry, such as analog measurement circuitry 614, such that the wireless test module is designed to take measurements that are typically made when manufacturing and debugging cable harnesses. In some embodiments, the wireless test module includes a plurality of electrical relays designed for high voltage capable solid state multiplexing block 616. In certain embodiments, the wireless test module includes lithium-ion rechargeable battery 608 (e.g., a 3400 milliampere-hour (mAh) lithium-ion rechargeable battery) which eliminates the need for cabled charge cabinets. As a result, the wireless test module may be configured to conduct low current, high voltage testing and communicate wirelessly with the central computer system (e.g., central computer system 130 of FIG. 1) under battery power.

In some embodiments, the wireless test module is configured to use the plurality of electronical components to conduct a variety of electrical checkouts by mating with a plurality of discrete electrical connectors of electronic wiring harnesses for aircraft and automobiles. For example, the wireless test module may use central processing and memory block 606 and analog measurement circuitry 614 to take measurements during testing of the electronic wiring harnesses for aircraft and automobiles. Likewise, the wireless test module may use central processing and memory block 606 to apply pick-by-light functionality for initial hardware selection and harness hookup processes. As another example, the wireless test module may use wireless block 602 to communicate with a radio transceiver powered by a control laptop, such as the central computer system, which sends various types of test instructions (e.g., test instructions 150 of FIG. 1) to the wireless test module for test execution and reporting. As another example, the wireless test module may apply an internal power source to one or more electrical wires of the electrical wiring harness in order to perform a test on the electrical wiring harness. The internal power source may include high voltage source 610 and/or low voltage source 612.

In some embodiments, the wireless test module (e.g., wireless test module 120 of FIG. 1) includes a power button to allow a user to turn on, turn off, or reset the wireless test module. The wireless test module may be configured to use a mini-USB connector, a charging port of the wireless test module, and charging and power block 604 to charge the wireless test module. Likewise, the wireless test module may be configured to use the mini-USB connector as a software debug port to update one or more software packages of the wireless test module at a high speed. In particular, the charging port of the wireless test module may interface with a plurality of pogo pins located in each slot of a WHAMS charging cart. The plurality of pogo pins may also be used for a battery pack of the wireless test module. When the wireless test module is powered off and power is applied to the charging port, the wireless test module may be configured to power on and begin charging. The wireless test module may include a plurality of light-emitting diode (LED) indicators to facilitate visual communication with the user visually. For example, the LED indicators are orange colored and located on an end of the wireless test module 120.

In some embodiments, the wireless test module (e.g., wireless test module 120 of FIG. 1) may be configured to operate independently or within a scalable network of wireless test modules for use on large harness assemblies. In particular, the wireless test module may be configured to generate a low voltage output of approximately 2.4 Volts (V) for a resistance/continuity test. Likewise, the wireless test module may be configured to generate a voltage output within a range of 100V to 500V for high voltage testing with a tolerance on the output voltage of +/−3%+/−2V. As a result, the wireless test module may be configured to measure resistance with an accuracy of 10%+/−1 ohm for a resistance in a 1 ohm to 50 ohm range. The wireless test module may be configured to measure resistance with an accuracy of 5%+/−1 ohm for a resistance in a 51 ohm to 250 ohm range. The wireless test module may be configured to measure resistance with an accuracy of 10%+/−1 ohm for a resistance in a 251 ohm to 1 million (M) ohm range. The wireless test module may be configured to measure resistance with an accuracy in a range of 6% and 10% using high voltages. For example, the accuracy for resistance measurements using the 100V high voltage is 10% for a resistance in a 1 M ohm to 50 M ohm range. As another example, the accuracy for resistance measurements using the 500V high voltage is 6% for a resistance in the 1 M ohm to 50 M ohm range.

WHAMS Hot-Swap Connectors

In some embodiments, the WHAMS is configured to perform one or more electronic tests for functional automated check (FAC) on a plurality of electronic wiring harnesses for vehicles such as aircraft and automobiles. The variety in connector types on the vehicles is immense. The WHAMS may use a plurality of wireless test modules to test every unique connector of the vehicles. Because the vehicles are tested in pieces, the plurality of wireless test modules may use hot-swap connectors to separate connectors from the plurality of wireless test modules to decrease production cost and increase flexibility of the WHAMS.

Figure 7A:
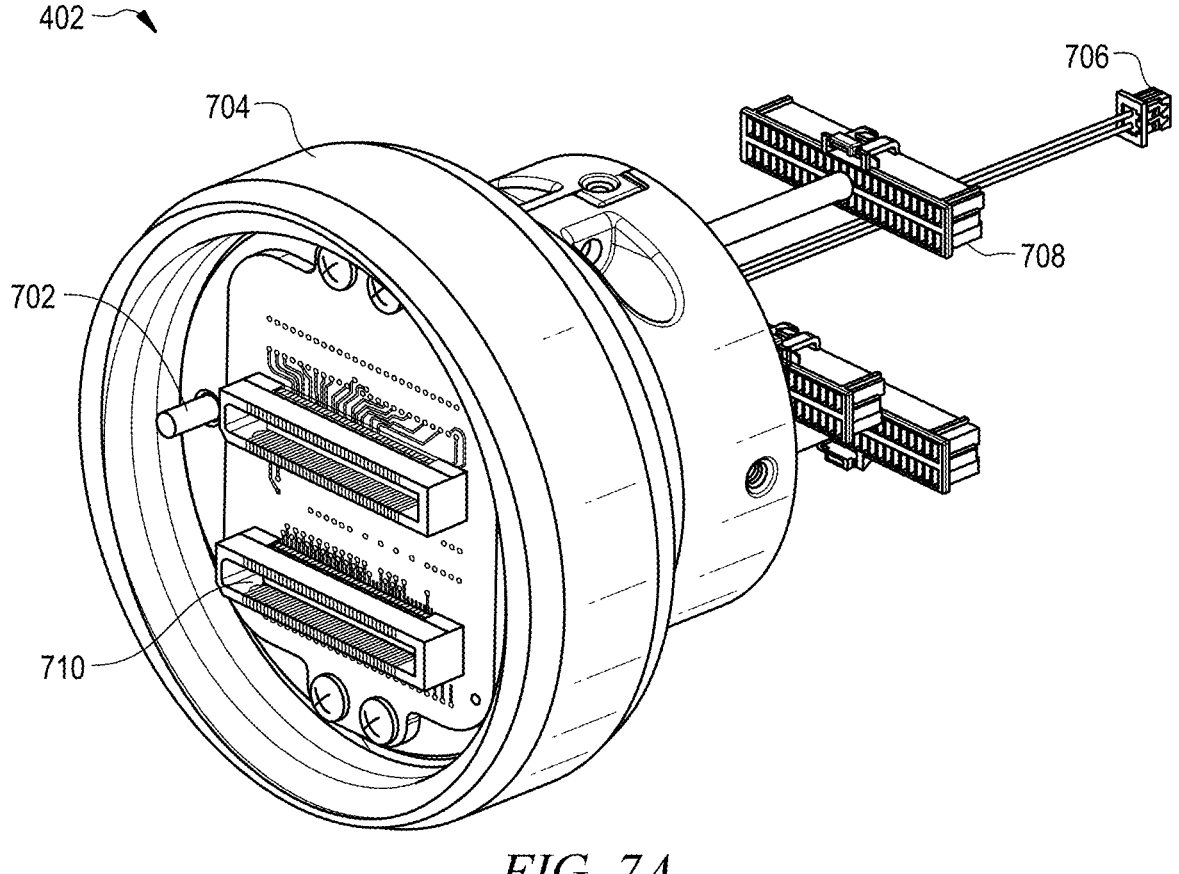
FIG. 7A illustrates a WTM side hot-swap connector coupling to a variable front end of FIG. 3, according to some embodiments.

FIG. 7A illustrates a WTM side hot-swap connector 402 operable to couple to a variable front end (e.g., variable front end 126 of FIG. 3), according to some embodiments. The wireless test module (e.g., wireless test module 120 of FIG. 1) includes a pair of hot-swap connectors, such as WTM side hot-swap connector 402 and front end side hot-swap connector 404 of FIG. 4, located between the chassis of the wireless test module and the variable front end of the wireless test module. A WHAMS may use a plurality of wireless test modules that include several types of connectors for FAC during testing of a plurality of electrical wiring harnesses. In particular, every unique connector may be accounted for in the FAC for vehicles such as aircraft and automobiles. Traditional WHAMS includes a plurality of connectors permanently mounted to a wireless test module that contains all of the processing functions. Because at least one wireless test module is required for each unique connector, the traditional WHAMS may incur high production costs for testing the plurality of electrical wiring harnesses.

The hot-swap connectors may significantly decrease production costs and increase flexibility of the WHAMS by separating the hot-swap connectors from the wireless test module. The number of wireless test modules is determined based on the number of tests required for the WHAMS.

In some embodiments, WTM side hot-swap connector 402 is a custom-designed universal connector. WTM side hot-swap connector 402 may be located on an end of the chassis of the wireless test module that is attached to another custom-designed universal connector, such as a front side hot-swap connector, located at an end of the variable front end that mates with the wireless test module. Thus, WTM side hot-swap connector 402 is operable to attach the variable front end of the wireless test module to the chassis of the wireless test module. Likewise, WTM side hot-swap connector 402 is operable to detach the variable front end of the wireless test module from the chassis of the wireless test module. WTM side hot-swap connector 402 is operable to transfer data from/to the wireless test module when the chassis of the wireless test module and the variable front end of the wireless test module mate. WTM side hot-swap connector 402 is operable to swap to a different wireless test module with address information updated automatically in real time in the event the wireless test module malfunctions.

In some embodiments, WTM side hot-swap connector 402 includes an alignment peg 702, a slip ring 704, an electrically erasable programmable read-only memory (EEPROM) read/write wire 706, a jumper harness 708, and a female connector, such as a surface-mount female connector 710. Alignment peg 702 is configured to mate to the variable front end of the wireless test module. Slip ring 704 is configured to secure the wireless test module in place for quick and secure connection. Thus, the variable front end may attach and detach quickly from the wireless test module. EEPROM read/write wire 706 may be integrated on a circuit board to read/write data of the wireless test module. EEPROM read/write wire 706 may be configured to couple to the chassis of the wireless test module. The wireless test module is operable to use a wireless transceiver to wirelessly communicate with the central computer system to transfer the data stored on an EEPROM (e.g., EEPROM 726 of FIG. 7B) associated with EEPROM read/write wire 706. jumper harness 708 is configured to couple to the wireless test module. Surface-mount female connector 710 includes a plurality of contacts in a range of 48 contacts to 128 contacts. For example, surface-mount female connector 710 may include 100 contacts.

Figure 7C:
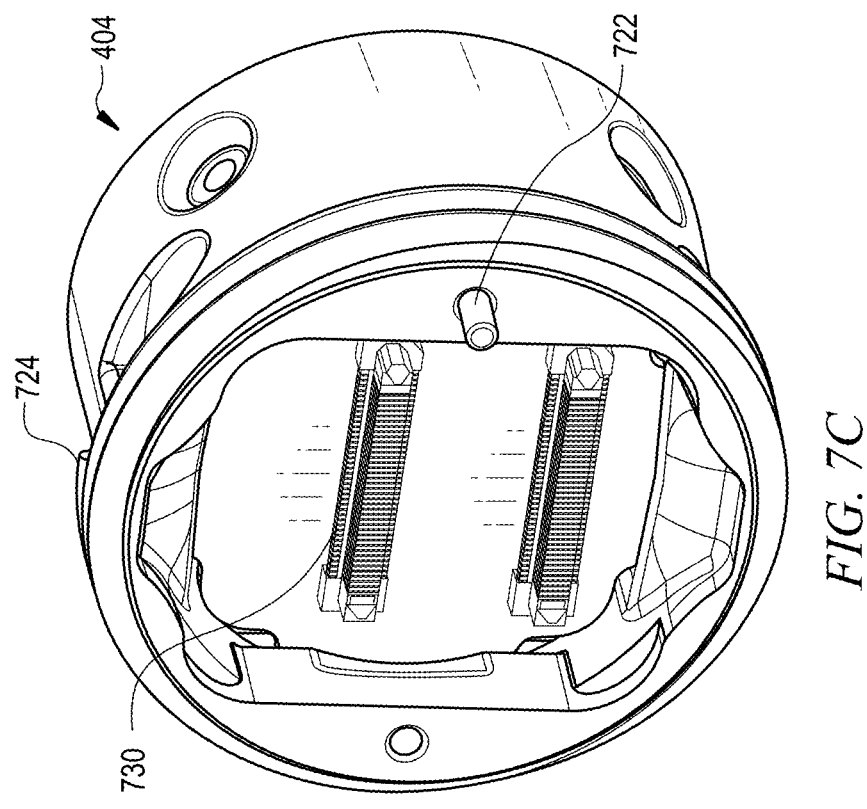
FIGS. 7B and 7C illustrate a front end side hot-swap connector coupling to the wireless test module of FIG. 3, according to some embodiments.
Figure 7B:
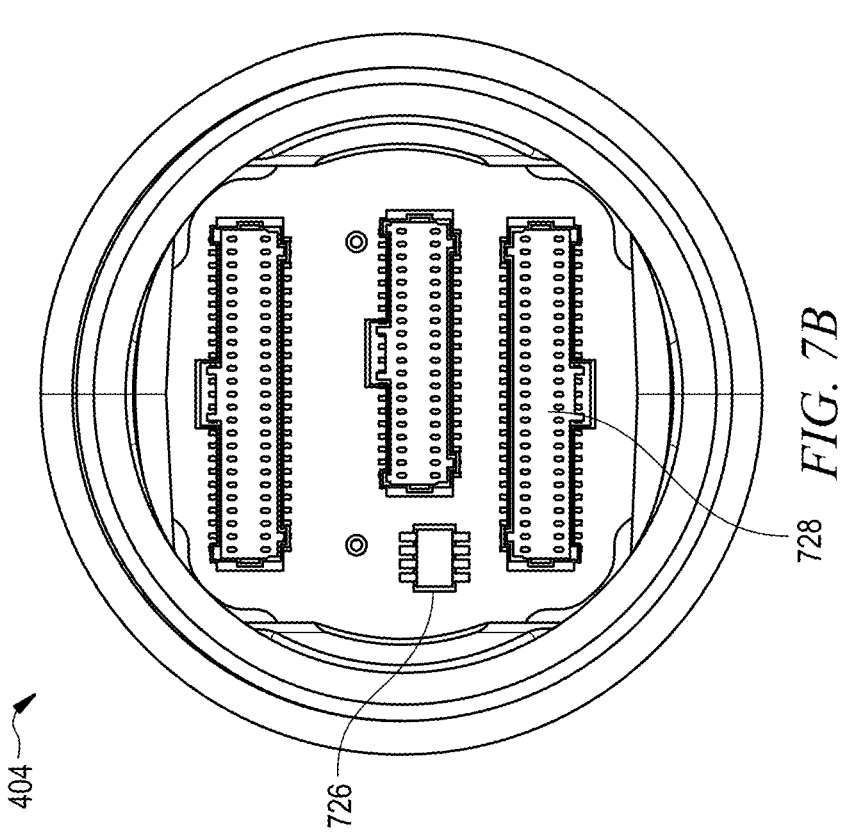

FIGS. 7B and 7C illustrate a front end side hot-swap connector 404 coupling to wireless test module 120 of FIG. 3, according to some embodiments. Front end side hot-swap connector 404 is a custom designed universal connector located on an end of the variable front end of the wireless test module that is attached to another custom designed universal connector, such as the WTM hot-swap connector, located at an end of the chassis of the wireless test module. Thus, front end side hot-swap connector 404 is operable to attach the variable front end of the wireless test module to the chassis of the wireless test module. Likewise, front end side hot-swap connector 404 is operable to detach the variable front end of the wireless test module from the chassis of the wireless test module. Front end side hot-swap connector 404 is operable to transfer data from/to the wireless test module when the chassis of the wireless test module and the variable front end of the wireless test module mate. Front end side hot-swap connector 404 is operable to swap to a different wireless test module with address information updated automatically in real time when the wireless test module malfunctions.

In some embodiments, front end side hot-swap connector 404 includes an alignment peg 722, a thread 724, an EEPROM 726, a plurality of connectors 728, and a male connector, such as a surface-mount male connector 730. Alignment peg 722 is configured to mate to the chassis of the wireless test module. Thread 724 is configured to mate with the slip ring (e.g., slip ring 704 of FIG. 7A) to secure the wireless test module in place for quick and secure connection. As a result, the variable front end may attach and detach quickly from the wireless test module. When attached, the variable front end is held securely in place with the slip ring and thread 724. EEPROM 726 may be integrated on a circuit board to store data of the wireless test module. The wireless test module is operable to use a wireless transceiver to wirelessly communicate with the central computer system to transfer the data stored on EEPROM 726. The data on EEPROM 726 may be automatically incorporated into a testing software of the central computer system without human data entry. Plurality of connectors 728 are configured to mate with a wire jumper to an aircraft connector. Surface-mount male connector 730 includes a plurality of contacts in a range of 48 contacts to 128 contacts. For example, surface-mount male connector 730 may include 100 contacts.

Figures 8A, 8B, 8C:
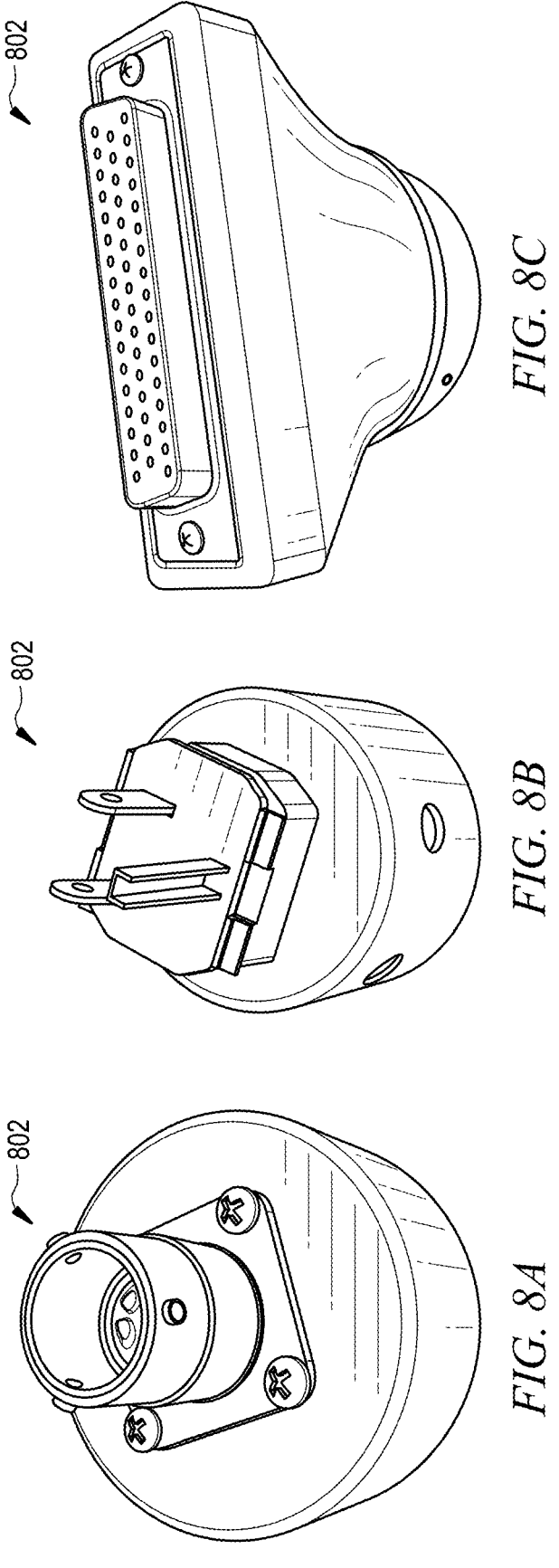
FIGS. 8A-8C illustrate example variable front ends that may be installed on the wireless test module of FIG. 3, according to some embodiments.

FIGS. 8A-8C illustrate example variable front ends 802 that may be installed on wireless test module 120 of FIG. 3, according to some embodiments. In particular, variable front ends 802 in FIGS. 8A-8C may couple to a wiring harness connector (e.g., wiring harness connector 115 of FIG. 1), such as an aircraft connector, with various pins.

WHAMS Battery Pack

In some embodiments, a wireless test module may use a portable charging battery pack to supply extra power when the wireless test module of the WHAMS runs off power with a low battery during testing. The portable charging battery pack is configured to prolong battery life for the wireless test module of the WHAMS if the wireless test module is left uncharged for an extended period of time.

Figure 9B:
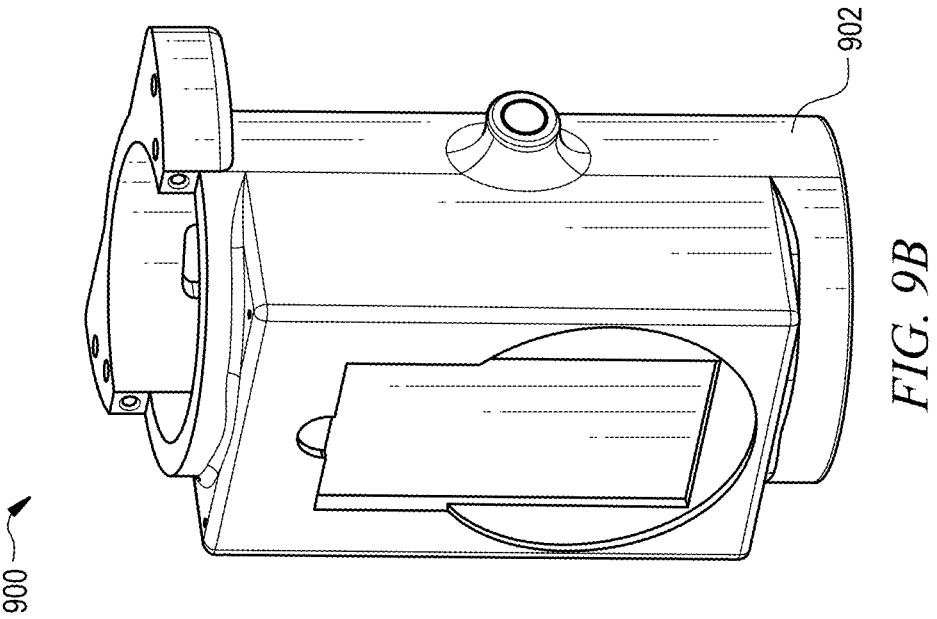
FIGS. 9A-9C illustrate a battery pack for a wireless test module, according to some embodiments.
Figure 9A:
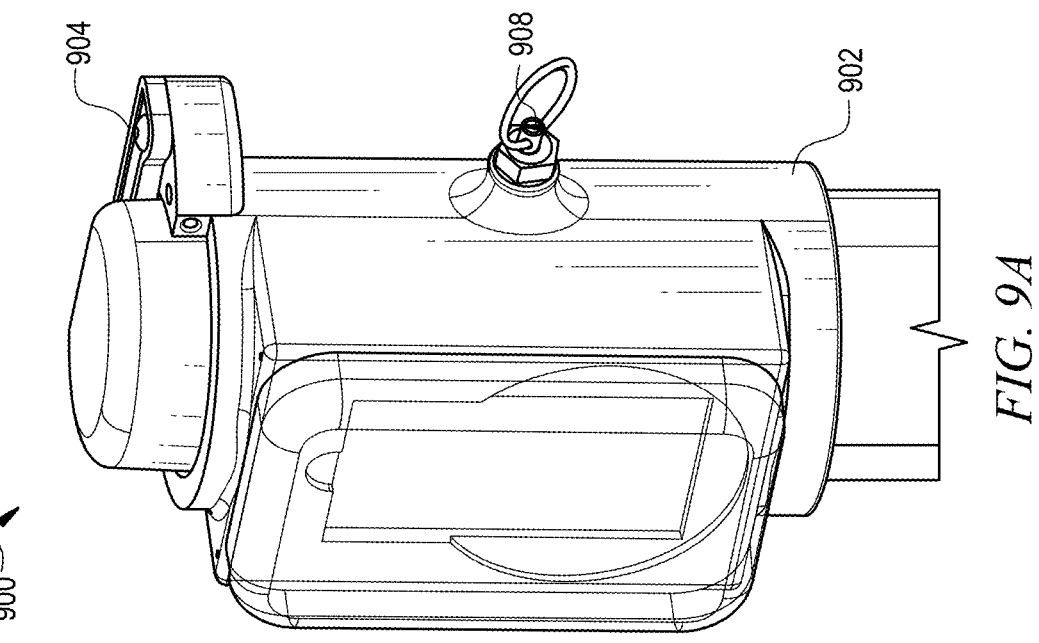
Figure 9C:
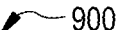

FIGS. 9A-9C illustrate a battery pack 900 for a wireless test module, according to some embodiments. Battery pack 900 provides a portable charging solution for the wireless test module to supply extra power to the wireless test module at a low battery level during testing. Battery pack 900 includes a wireless charging battery, a wireless battery pack holder 902, an injected molded pogo pin holder 904, and a wireless charging receiver 906. Wireless battery pack holder 904 is operable to contain the wireless charging battery. In certain embodiments, wireless battery pack holder 904 is a three-dimensional (3D) printed piece comprising a shape that allows wireless battery pack holder 902 to slip over an end of the wireless test module. Thus, wireless battery pack holder 904 may house a plurality of components necessary to make battery pack 900 functional.

Figure 10:
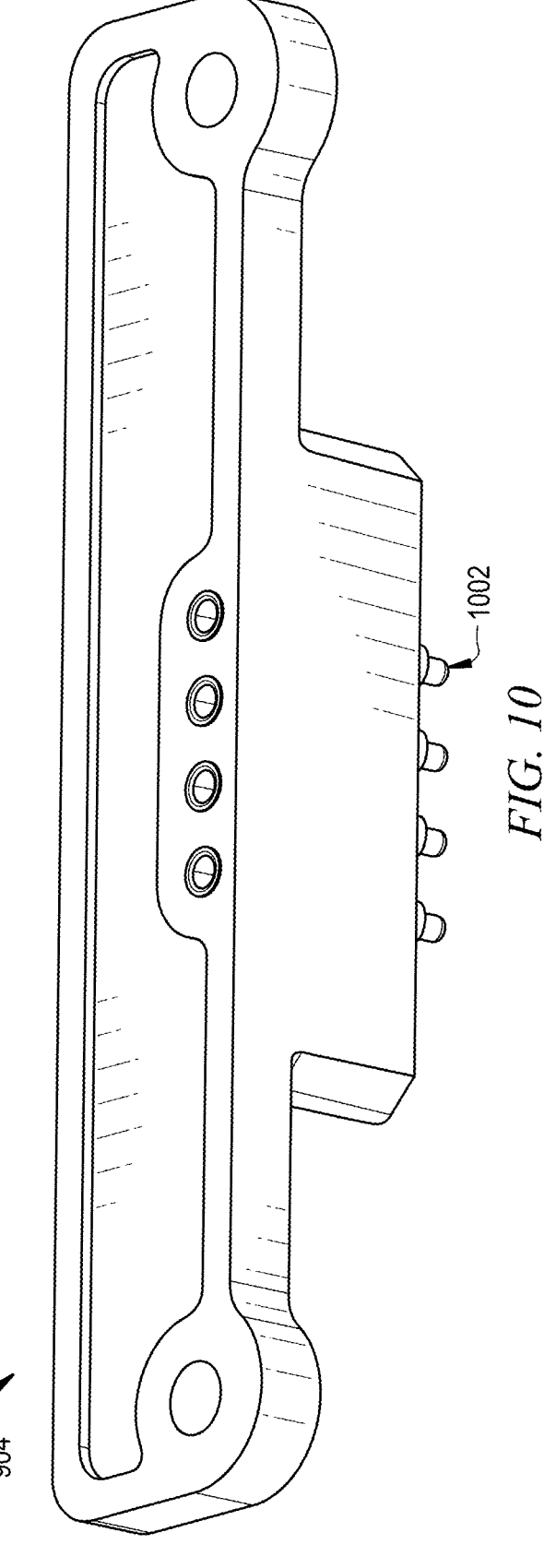
FIG. 10 illustrates an injected molded pogo pin holder of the battery pack of FIGS. 9A-9C, according to some embodiments.

In some embodiments, the injected molded pogo pin holder 904 includes a plurality of pogo pins (e.g., pogo pins 1002 of FIG. 10). Injected molded pogo pin holder 904 is coupled to wireless battery pack holder 902 using a first set of fasteners (e.g., screws). Likewise, injected molded pogo pin holder 904 is operable to couple to the wireless test module. Wireless charging receiver 906 is operable to wirelessly charge the wireless charging battery. Thus, battery pack 900 is configured to charge the wireless test module by contacting the plurality of pogo pins with a compatible wireless charging battery pack. In particular, the battery pack includes a steel retractable spring plunger 908 that includes pull rings operable to hold battery pack 900 together by attaching to the wireless test module using a second set of fasteners (e.g., screws). Battery pack 900 includes a magnet 910 attached to wireless charging receiver 906. Magnet 910 is operable to latch battery pack 900 onto the wireless test module. In certain embodiments, wireless charging receiver 906 includes a 5 Volt (V) Qi standard wireless charging receiver 912 that includes a magnetic plate compatible with magnet 910.

In some embodiments, battery pack 900 is configured to prolong battery life of the wireless test module, which may be left uncharged for an extended period of time. For example, battery pack 900 may couple to the wireless test module to provide extra power for performing one or more electrical tests on an electrical wiring harness (e.g., continuity checks, voltage isolation checks, diode polarity checks, resistance measurement checks, etc.). In particular, the wireless test module may include an electrical connector that is operable to mate to a wiring harness connector of the electrical wiring harness. The wireless test module is operable to perform the one or more tests to validate the electrical wiring harness according to a plurality of test instructions received from the central computer system. In particular, the wireless test module is operable to communicate wirelessly with the central computer system using WI-FI, Bluetooth, or Zigbee.

FIG. 10 illustrates injected molded pogo pin holder 904 of the battery pack of FIGS. 9A-9C, according to some embodiments. Injected molded pogo pin holder 904 may include a plurality of pogo pins 1002, which may be fastened (e.g., screwed) to the wireless battery pack holder.

WHAMS Charging Cart

In some embodiments, the WHAMS may use a mobile charging cart to charge a plurality of wireless test modules in parallel. The mobile charging cart is configured to hold and charge the plurality of wireless test modules and locate the plurality of wireless test modules when needed for testing. As a result, the mobile charging cart may ensure the plurality of wireless test modules are completely charged at time of production use. Likewise, the mobile charging cart may locate the plurality of wireless test modules through a pick by flight function which lights up the plurality of wireless test modules that is called for when needed for testing.

Figures 11A, 11B, 11C:
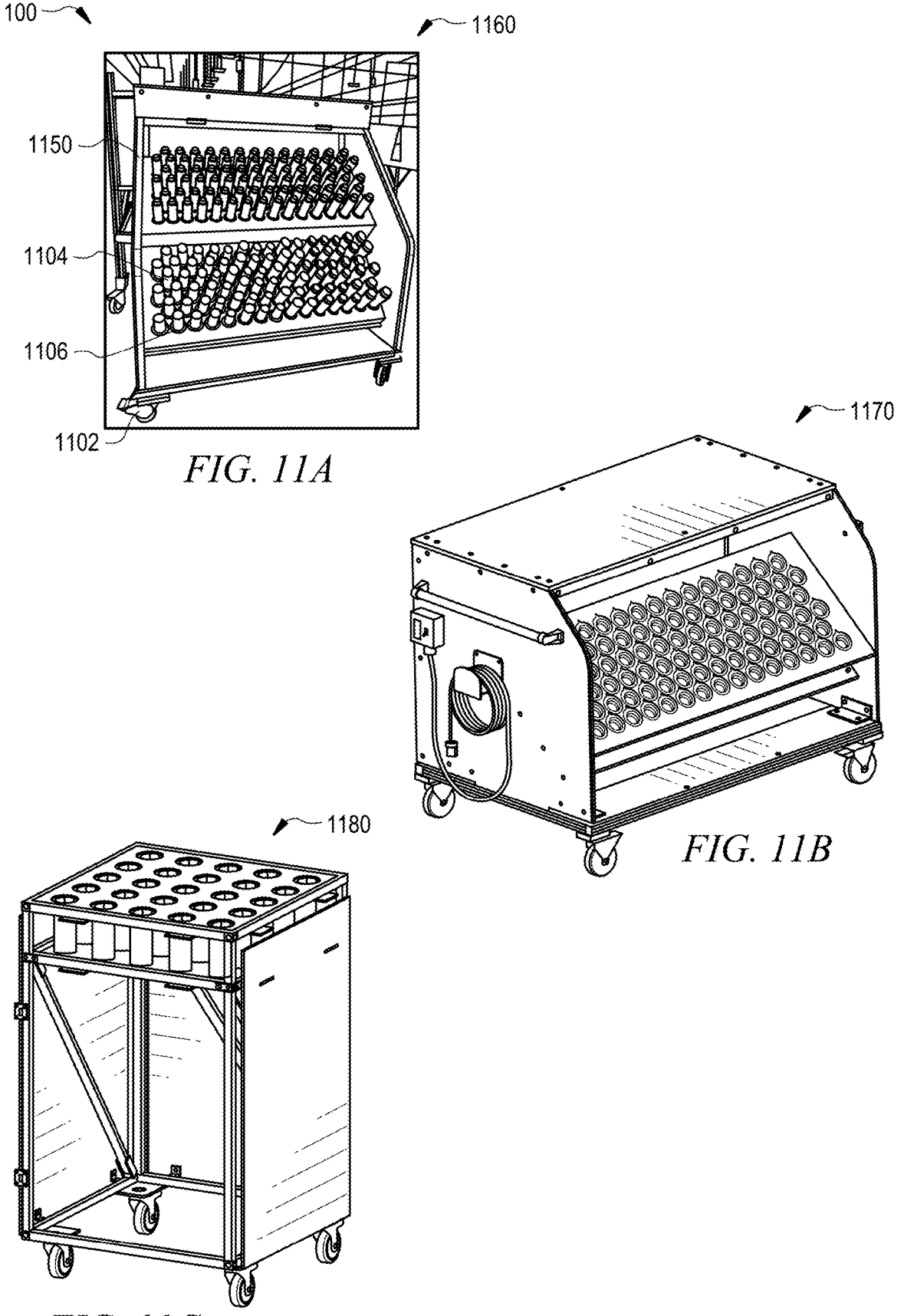
FIGS. 11A-11F illustrate charging cart systems for storing multiple wireless test modules, according to some embodiments.

FIGS. 11A-11F illustrate charging cart systems 1100 for storing multiple wireless test modules, according to some embodiments. Charging cart system 1100 is mass charging apparatus that is configured to hold and charge a plurality of wireless test modules for production use. Charging cart system 1100 includes three sizes: (1) a double deck charging cart 1160, as illustrated in FIG. 11A, (2) a single deck charging cart 1170, as illustrated in FIG. 11B, and 3) a mini charging cart 1180, as illustrated in FIG. 11C. FIG. 11A shows how double deck charging cart 1160 may hold a plurality of charging slots in a range of 150 charging slots to 200 charging slots. FIG. 11B shows how single deck charging cart 1170 may hold a plurality of charging slots in a range of 50 charging slots to 100 charging slots. FIG. 11C shows how mini charging cart 1180 may hold a plurality of charging slots in a range of 20 charging slots to 30 charging slots. For example, double deck charging cart 1160 may hold 174 charging slots. As another example, single deck charging cart 1170 may hold 87 charging slots. As another example, mini charging cart 1180 may hold 25 charging slots.

Figures 11D, 11E, 11F:
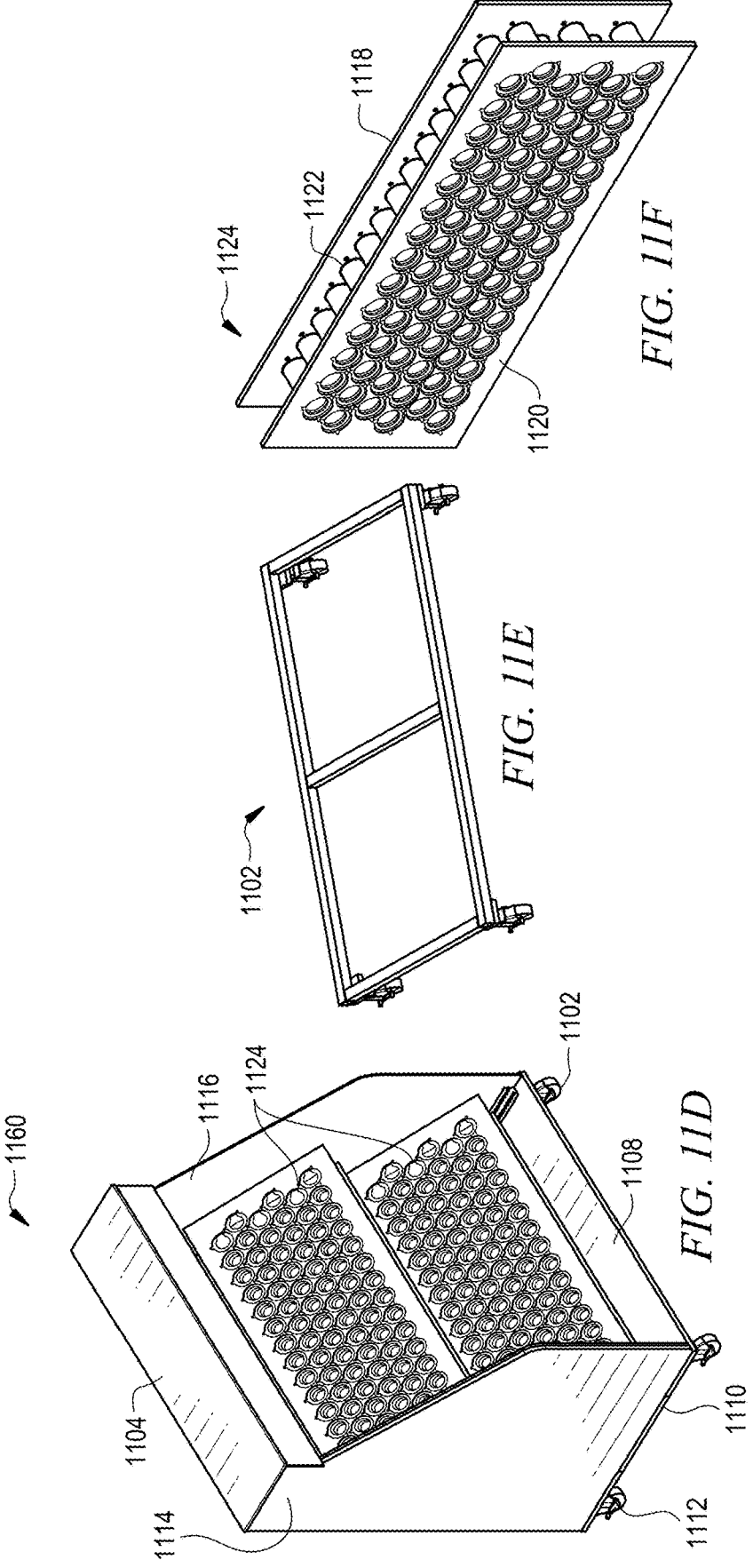

In some embodiments, charging cart system 1100 includes a mobile aluminum frame 1102, a charging cart 1150, a plurality of LED indicators 1104, and a plurality of charging slots 1106. In particular, FIGS. 11D-11F show charging cart 1160, which includes a bottom front 1108, a bottom middle 1110, a bottom back 1112, a side left 1114, a side right 1116, a back sheet 1118, a front sheet 1120, and a plurality of pipes 1122. These components may be assembled using polyvinyl chloride (PVC) sheets and PVC pipes to support the charging cart. The PVC sheets may be 0.5 inch thick type 1 PVC sheets. The PVC pipes may be 2 inch in diameter schedule 40 PVC pipes.

FIG. 11E shows aluminum frame 1102. Charging cart 1150 is connected to the aluminum frame 1102 using fasteners (e.g., bolts). Plurality of LED indicators 1104 of FIG. 11A are operable to identify a status of the plurality of the wireless test modules during testing of the WHAMS. Plurality of charging slots 1106 of FIG. 11A are operable to charge the plurality of the wireless test modules. Each of the plurality of charging slots is associated with a respective one of plurality of LED indicators 1104. In some embodiments, the charging cart may charge more than 100 wireless test modules in parallel using a power supply which is operable to supply a power of 1500 Watts (W). As another example, the charging cart may locate the plurality of wireless test modules using a find by light function to light up one or more wireless test modules that are used for testing. As a result, the charging cart may include a foundation assembled by a plurality of PVC sheets and PVC pipes. The foundation may include one or more decks, such as sheet assemblies 1124 of FIG. 11F, welded on the charging cart to allocate the plurality of charging slots. The plurality of charging slots are keyed slots to receive the plurality of wireless test modules to ensure the plurality of wireless test modules are correctly placed. FIG. 11F shows how each sheet assembly 1124 may include a back sheet 1118, a front sheet 1120, and a plurality of PVC pipes 1122.

Figure 12:
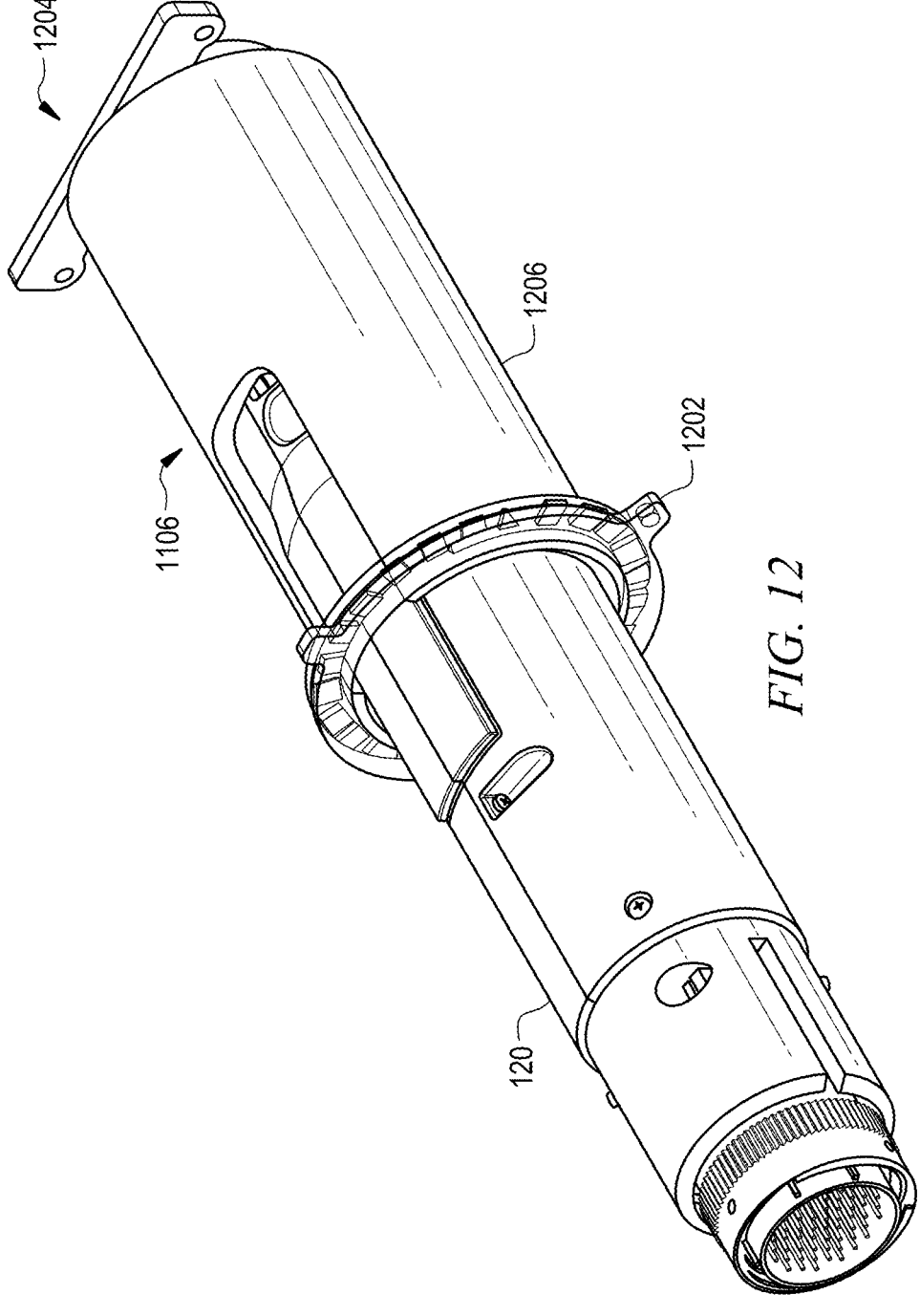
FIGS. 12-14D illustrate more details of the charging cart of FIGS. 11A-11F, according to some embodiments.
Figure 13:
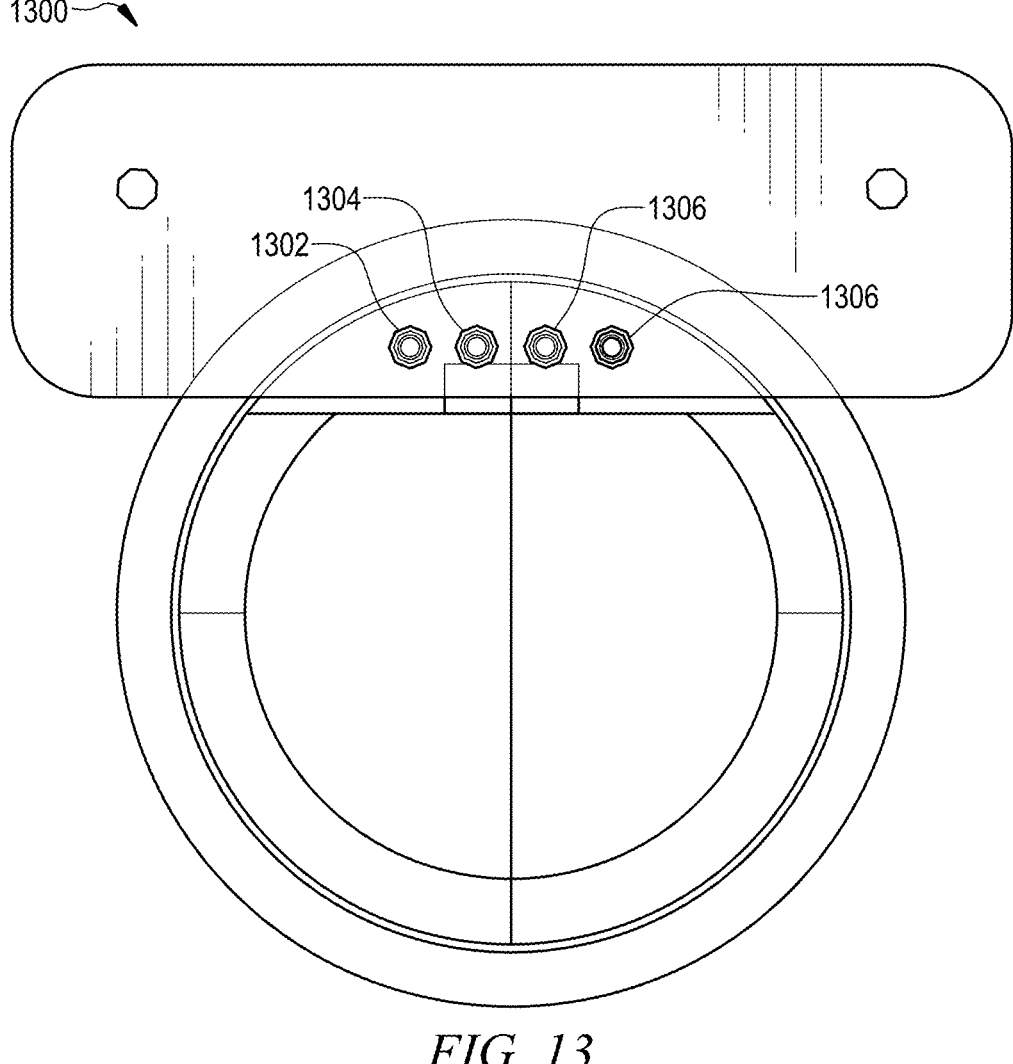

FIGS. 12-14D illustrate more details of charging cart system 1100 of FIGS. 11A-11F, according to some embodiments. FIG. 12 shows how the charging cart may be configured to use an injection molded pogo pin block 1204 to charge wireless test module 120 attached to a charging slot 1106. In particular, injection molded pogo pin block 1204 may include a 4-pin layout 1300, as illustrated in FIG. 13, for charging wireless test module 120 and a light indication using an LED ring 1206 that includes a plurality of red LEDs and a plurality of green LEDs in an alternating order along LED ring 1206. LED ring 1206 may include a ring cover 1202 (e.g., a clear polycarbonate LED ring cover).

FIG. 13 shows 4-pin layout 1300 for the injection molded pogo pin block 1204 of FIG. 12. 4-pin layout 1300 includes a power source pin 1302, a ground pin 1304, and a plurality of LED pins 1306. Power source pin 1302 may be a 5 V pin. Plurality of LED pins 1306 may include a red LED pin and a green LED pin. As a result, the charging cart is configured to use the injection molded pogo pin block to charge the wireless test module and provide a light indication to assist in locating the wireless test module.

Figure 14A:
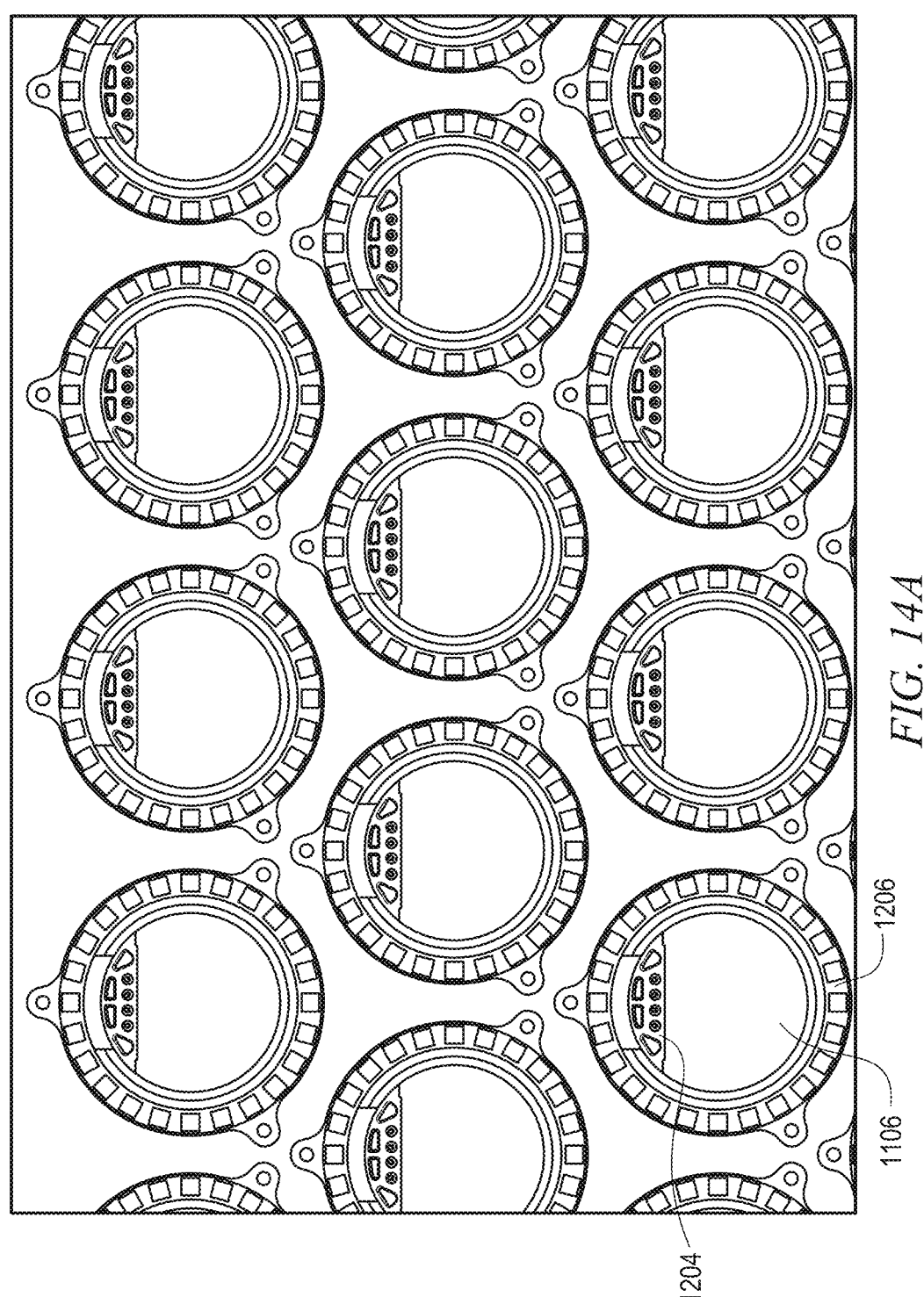
Figure 14B:
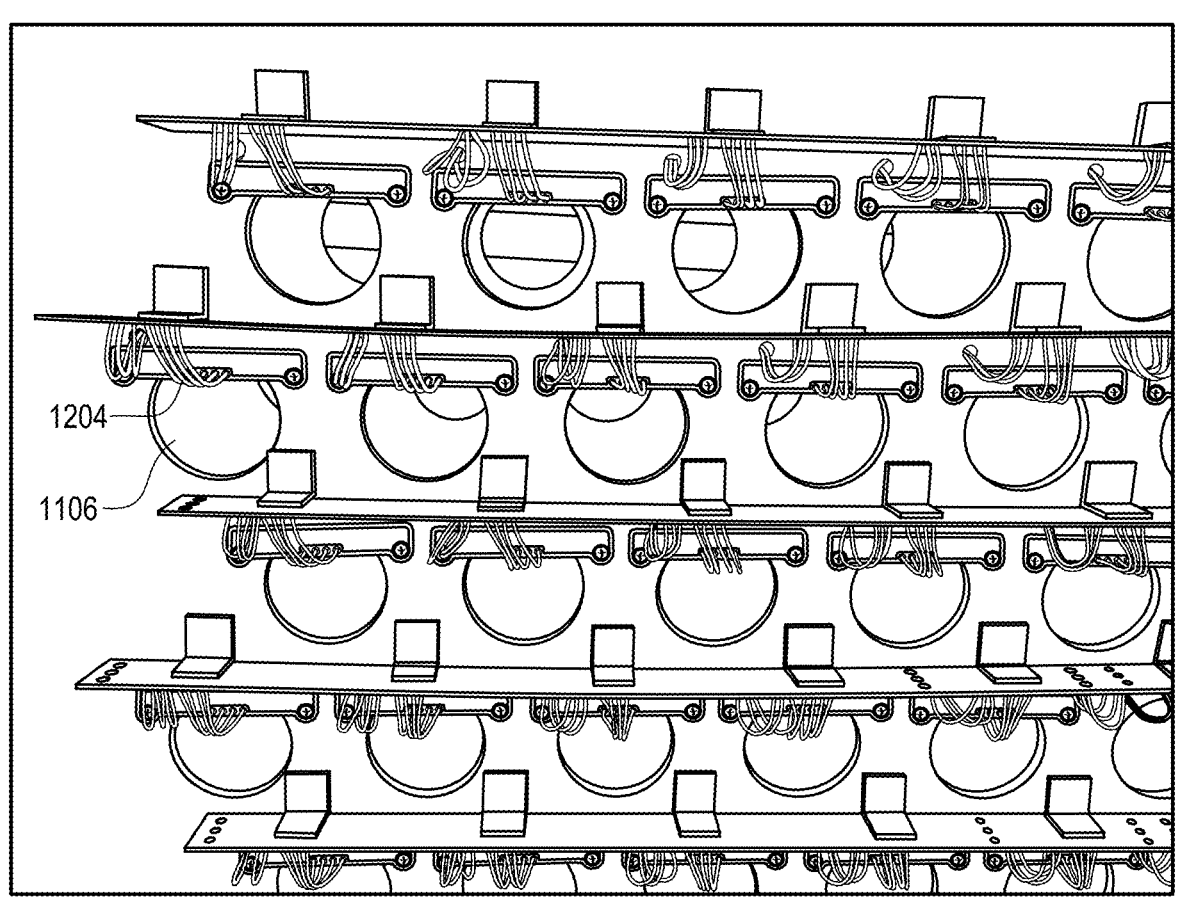
Figure 14C:
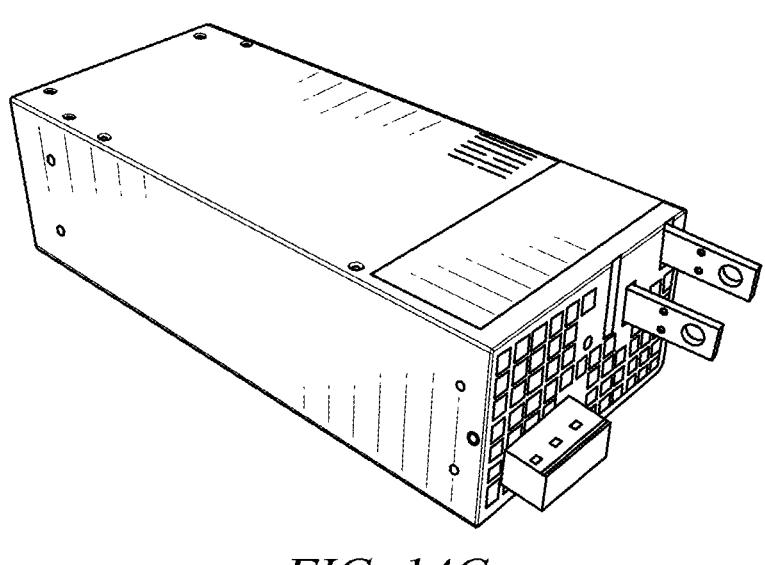
Figure 14D:
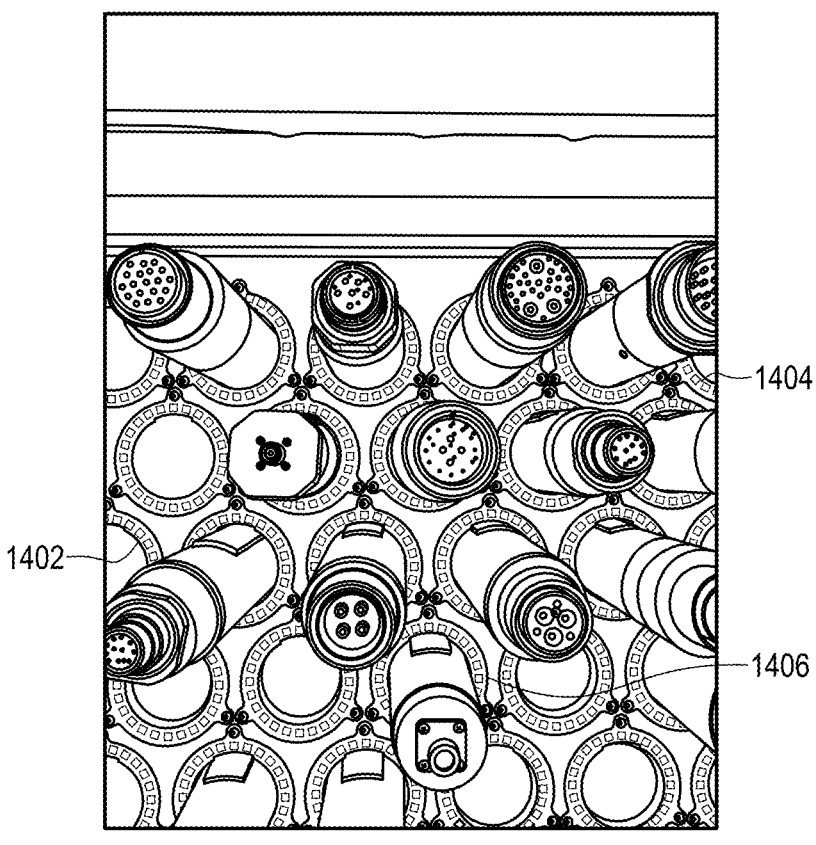

FIGS. 14A and 14B illustrate a layout 1400 of a plurality of charging slots 1106 on a deck in charging cart system 1100 of FIGS. 11A-C. Each of the plurality of charging slots 1106 is associated with a respective injection molded pogo pin block 1204 and a respective LED ring 1206. FIG. 14C shows a 1500 W single output power supply operable to supply power to the plurality of wireless test modules in the charging cart. FIG. 14D shows a plurality of LED indicators 1104 that may assist in identifying the status of a respective wireless test module, as well as help locate where the modules are at any given time. In particular, each of the plurality of LED indicators turns red to indicate that an identified wireless test module associated with the respective LED indicator is currently charging. Each of the plurality of LED indicators turns green to indicate an identified wireless test module associated with the respective LED indicator to locate before testing. Each of the plurality of LED indicators turns off to indicate that an identified wireless test module associated with the respective LED indicator finishes charging. For example, a red LED 1402 indicates that an identified wireless test module associated with the red LED 1402 is currently charging. As another example, a green LED 1404 indicates that an identified wireless test module associated with the green LED 1404 to locate before testing. As another example, a light-off LED 1406 indicates that an identified wireless test module associated with the light-off LED 1406 finishes charging.

WHAMS Calibration

Certain embodiments relate to a calibration method for calibrating the wireless test module 120 of FIG. 1. It is critical to calibrate the wireless test module of the WHAMS in order to accurately read resistance measurements when to perform one or more electrical tests on an electrical wiring harness (e.g., continuity checks, voltage isolation checks, diode polarity checks, resistance measurement checks, etc.). Before testing of the WHAMS, the wireless test module is subject to a controlled periodic calibration process to ensure the wireless test module may read resistance accurately. In particular, the wireless test module may include a plurality of field effect transistors (FETs). The plurality of FETs may be optically isolated MOFFETS. When the wireless test module is not properly calibrated, measurements of internal resistance of the plurality of FETs of the wireless test module may drift over time.

Figure 15:
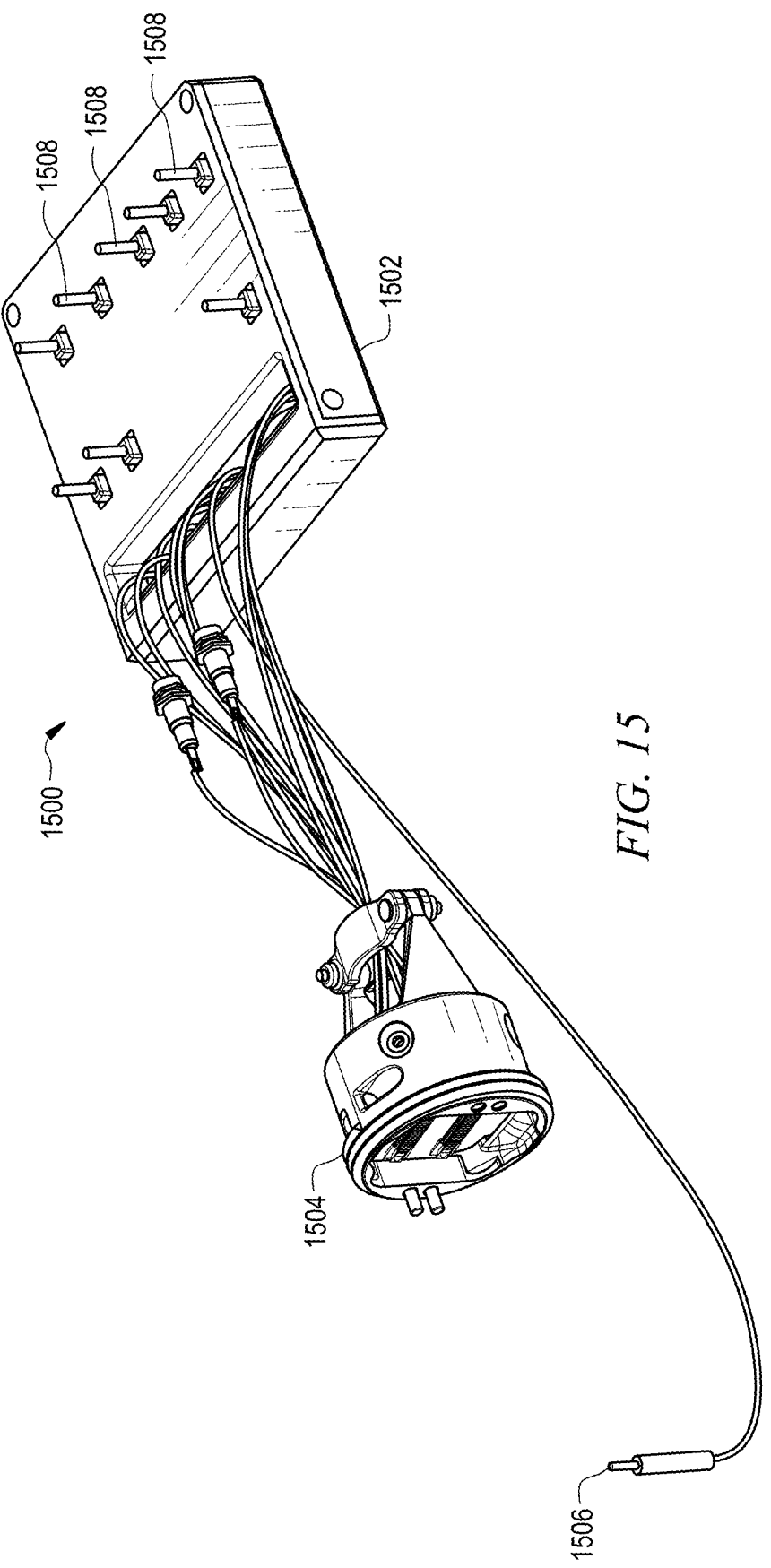
FIG. 15 illustrates a calibration fixture for a wireless test module, according to some embodiments.

FIG. 15 illustrates a calibration fixture 1500 for a wireless test module, according to some embodiments. Calibration fixture 1500 includes a switchboard 1502, a connector 1504, and a grounding cable 1506. In certain embodiments, switchboard 1502 includes a plurality of switches 1508. Connector 1504 is used to attach calibration fixture 1500 to the wireless test module. Grounding cable 1506 is used to connect calibration fixture 1500 directly to the earth. The calibration method may use calibration fixture 1500 to apply the controlled periodic calibration process in an automated approach to record the internal resistance of each of the plurality of FETs. The controlled periodic calibration process may include one or more of the following five operations: (1) run internal measurement tests, (2) run resistance accuracy tests (RATs), (3) store calibration factors, (4) store RAT history, and (5) recall updated calibration factors at test time. Calibration fixture 1500 is configured to short the wireless test module in the internal measurement tests and the RATs to provide measurements for the internal resistance of the wireless test module in the internal measurement tests and a plurality of resistors in the RATs. As a result, the plurality of resistors may be measured and recorded regularly by a calibrated ohmmeter, such as the calibration fixture 1500. The calibration method may determine if there is resistor shift by comparing the measurements for the plurality of resistors in the RATs to an original calibration standard.

Figure 16A:
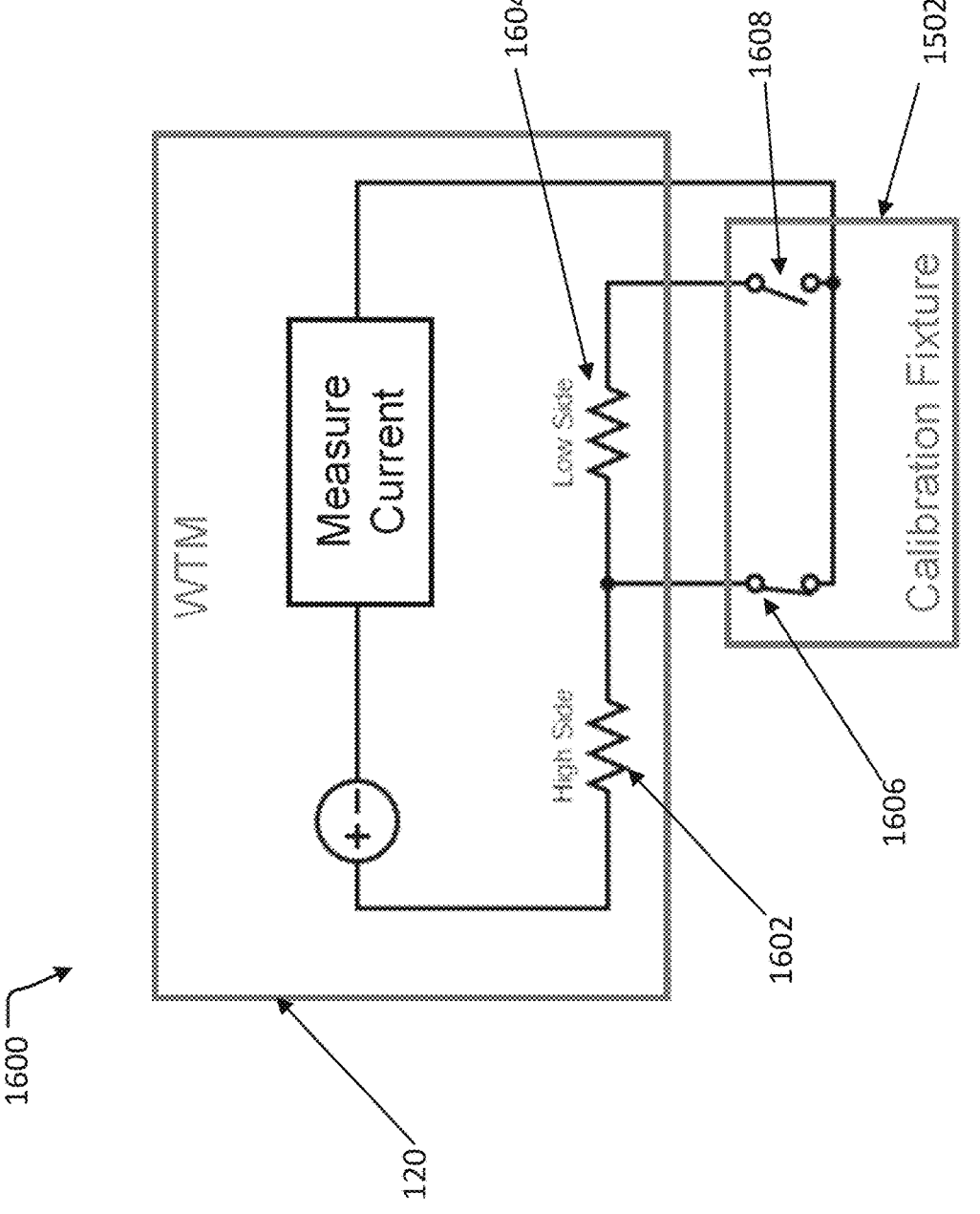
FIGS. 16A and 16B illustrate internal measurement tests using the calibration fixture of FIG. 15, according to some embodiments.
Figure 16B:
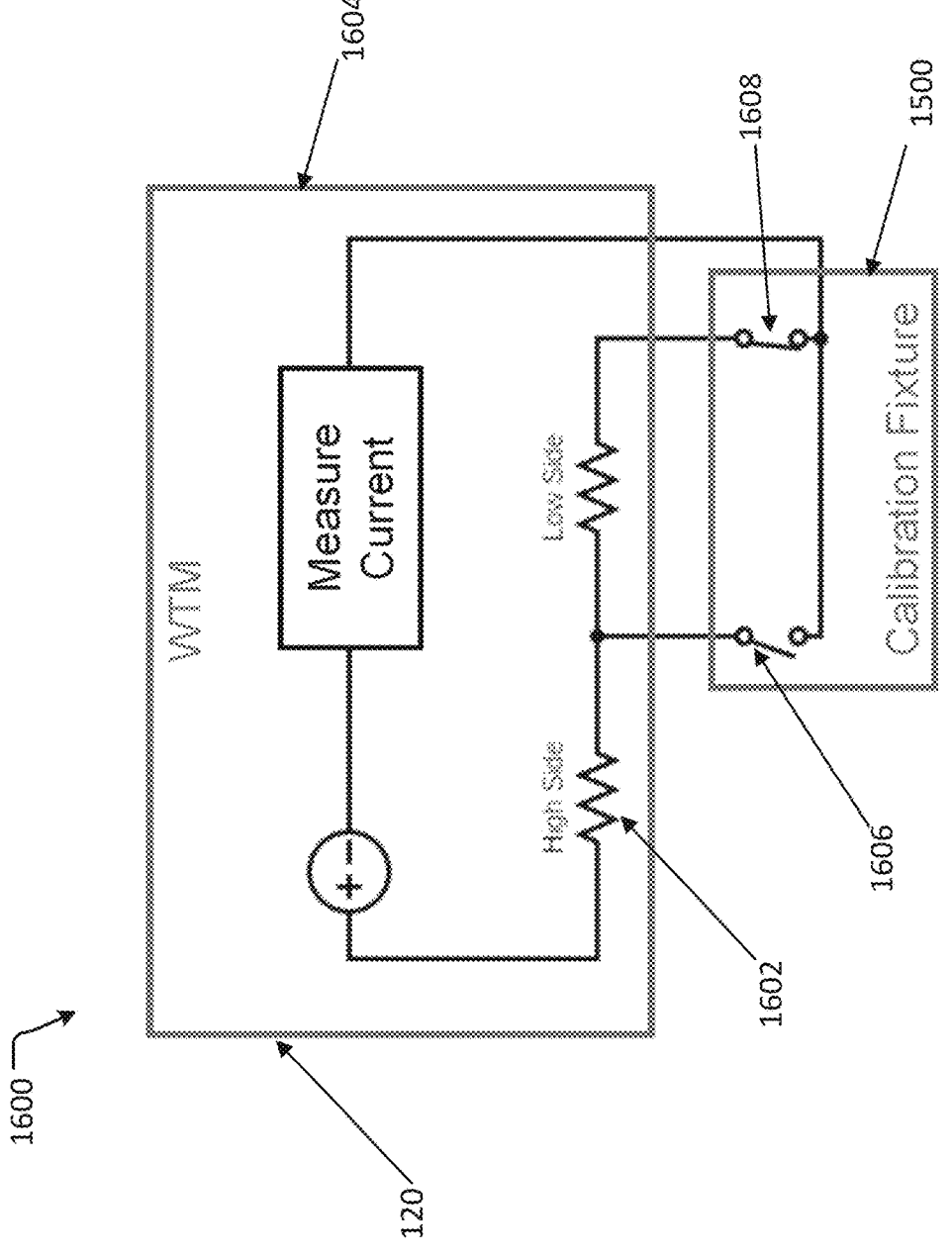

FIGS. 16A and 16B illustrate internal measurement tests 1600 using the calibration fixture 1500 of FIG. 15, according to some embodiments. The wireless test module 120 includes a relay with a plurality of FETs, such as a high side FET 1602 and a low side FET 1604. High side FET 1602 has a high side resistance. Low side FET 1604 has a low side resistance. Likewise, calibration fixture 1500 includes a first switch 1606 and a second switch 1608. The calibration method may use first switch 1606 and/or second switch 1608 to measure different "on" resistance components of the relay of wireless test module 120.

FIG. 16A shows first switch 1606 is turned on and second switch 1608 is turned off. When the calibration method uses calibration fixture 1500 to run calibration on wireless test module 120, the calibration method measures a first resistance value of the plurality of FETs from a first internal measurement test for wireless test module 120. The first resistance value measures resistance on a first path along high side FET 1602 of wireless test module 120 and calibration fixture 1500. Thus, the first resistance value is associated with a resistance of high side FET 1602, contact resistances, and trace/wire resistance on a calibration board. For example, the first resistance value may be in a range of 80 ohms to 90 ohms.

FIG. 16B shows first switch 1606 is turned off and second switch 1608 is turned on. When the calibration method uses calibration fixture 1500 to run calibration on wireless test module 120, the calibration method measures a second resistance value of the plurality of FETs from a second internal measurement test for wireless test module 120. The second resistance value measures resistance on a second path along both high side FET 1602 and/or low side FET 1604 of wireless test module 120 and calibration fixture 1500. Thus, the second resistance value is associated with a resistance of high side FET 1602, a resistance of low side FET 1604, contact resistances, and trace/wire resistance on a calibration board. For example, the first resistance value may be in a range of 120 ohms to 140 ohms. As a result, the first resistance value of the FETs measures the high side resistance associated with high side FET 1602. The second resistance value of the FETs measures a summation of both the high side resistance associated with high side FET 1602 and the low side resistance associated with low side FET 1604.

In some embodiments, the calibration method determines a resistance calibration value by subtracting the first resistance value of the plurality of FETs from the second resistance value of the plurality of FETs. The resistance calibration value is a low side calibrated value. For example, the resistance calibration value may be in a range of 40 ohms to 50 ohms. The calibration method may compare the resistance calibration value to a predetermined value. For example, if the predetermined value for low side FET 1604 is 45 ohms, the calibration method may determine that the resistance calibration value matches the predetermined value. As a result, the calibration method is configured to perform the RATs using a plurality of resistors of calibration fixture 1500. As another example, if the predetermined value for the low side FET 1604 is 60 ohms, the calibration method may determine that the resistance calibration value does not match the predetermined value. The calibration method determines a failed result for the controlled periodic calibration process for wireless test module 120.

Figure 17:
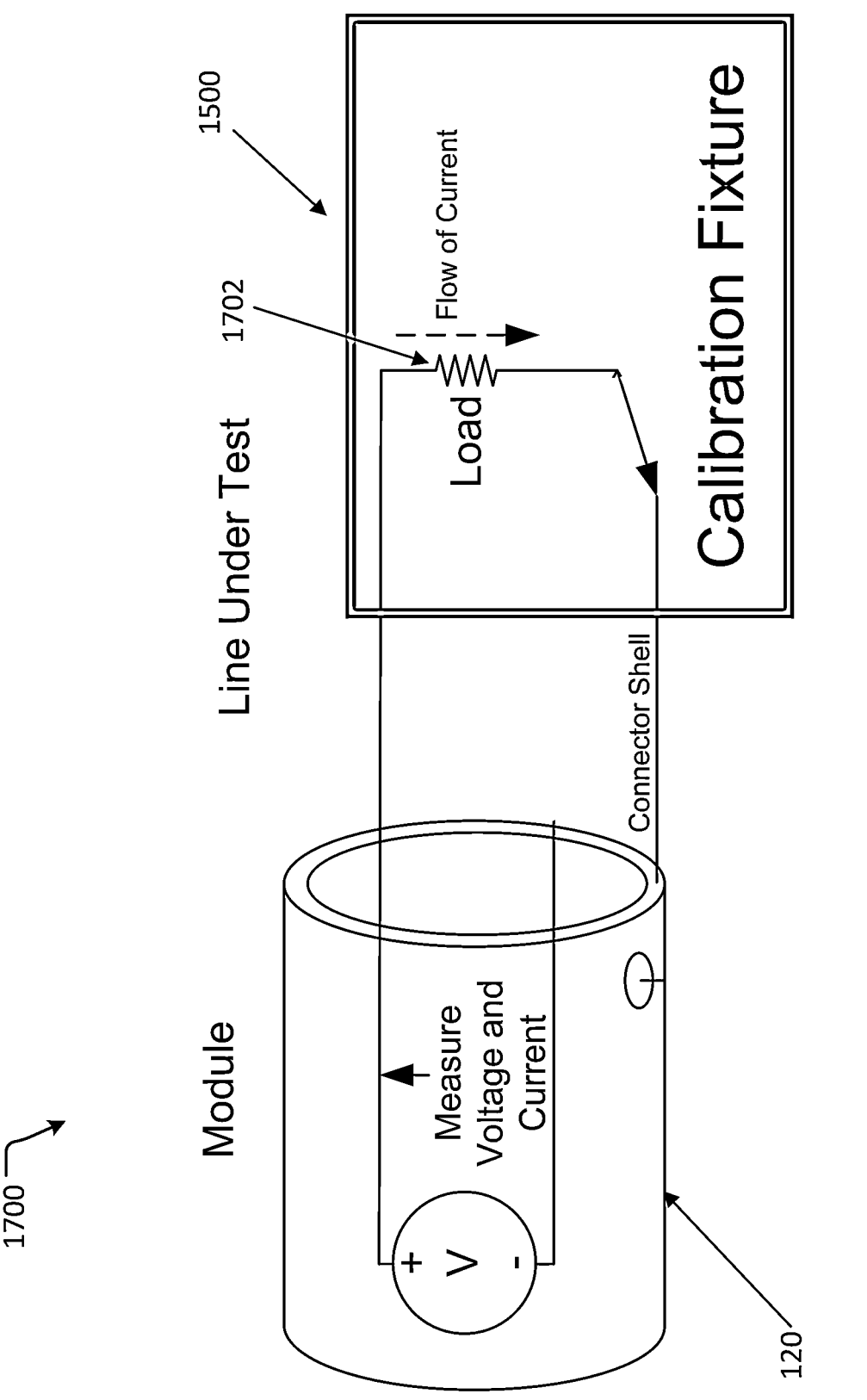
FIG. 17 illustrates a resistance accuracy test using the calibration fixture of FIG. 15, according to some embodiments.

FIG. 17 illustrates a resistance accuracy test 1700 using calibration fixture 1500 of FIG. 15, according to some embodiments. Resistance accuracy test 1700 is configured to validate a plurality of resistors of calibration fixture 1500. For example, the plurality of resistors may have resistor values in a range from 1 ohm to 50 M ohms. In particular, calibration fixture 1500 may use a plurality of pins to adjust the resistor values of calibration fixture 1500. All pins run the RATs with a 1 ohm value, and one pin runs the RATs with higher values. The calibration method selects a resistor 1702 from the plurality of resistors of calibration fixture

1500 and a test, such as a continuity test, associated with the wireless test module 120. The selected resistor 1702 is associated with a target resistor value, such as 2 ohms. The calibration method uses calibration fixture 1500 and the test to measure a plurality of calibration factors. For example, the plurality of calibration factors for the continuity test includes a high side calibration indicator on a source side, a high side calibration factor on a sink side, and an initial resistor value.

In some embodiments, the calibration method determines a measured resistor value using the plurality of calibration factors. For example, the measured resistor value for the continuity test is determined by subtracting the high side calibration indicator on the source side and the high side calibration factor on the sink side from the initial resistor value. As a result, the calibration method compares the measured resistor value to the target resistor value. When the measured resistor value matches the target resistor value, the calibration method determines the test passes. When the measured resistor value does not match the target resistor value, the calibration method determines the test fails. As a result, the calibration method may store the measured resistor value and the target resistor value in a database of the central computer server. Likewise, the calibration method may store the plurality of calibration factors and RAT history associated with the RAT in the databased of the central computer server. Therefore, the calibration method may perform a plurality of RATs on wireless test module 120 using the plurality of resistors of calibration fixture 1500 to detect a potential mode of failure using resistance of the FETs drifting over a period of time.

WHAMS Operating Software

Some embodiments relate to a controlling method for managing a plurality of wireless test modules of a WHAMS on a plurality of electrical wiring harnesses. The plurality of wireless test modules of the WHAMS may wirelessly communicate with a central computer system. In particular, the controlling method is applied using a plurality of operating components during testing of the WHAMS: (1) a wireless test module board support component, (2) a custom power controller component, and (3) a test generation, execution, and module management component. The wireless test module board support component is configured to use a wireless test module board support package to apply a core operating application for the plurality of wireless test modules. In particular, the core operating application may implement a two-way testing approach to perform one or more electrical tests on the plurality of electrical wiring harnesses (e.g., continuity checks, voltage isolation checks, diode polarity checks, resistance measurement checks, etc.) according to the plurality of test instructions received from the central computer system.

In some embodiments, the custom power controller component is configured to implement a custom power controller suite to manage a plurality of batteries for the plurality of wireless test modules. In some embodiments, the test generation, execution, and module management component is configured to implement one or more algorithms to generate a test plan and/or a graphic user interface (GUI) for running various system functions. In particular, the test plan may include a map of the plurality of electrical wiring harnesses, a plurality of harness connections associated with each of the plurality of wireless test modules, a hookup file, and one or more electrical tests associated with the plurality of electrical wiring harnesses. For example, the hookup file defines the plurality of wireless test modules assigned to the plurality of harness connections. As another example, the test plan is generated using additional harness information of splices, passive equipment, and resignment of lose leads. In particular, the test plan is generated to check wires and unused pins in network configurations for each of the plurality of electrical wiring harnesses. Thus, the test generation, execution, and module management component may interpret wire lists for the plurality of electrical wiring harnesses and generate a test plan based on testing criteria received from a user. In particular, the test generation, execution, and module management component is configured to determine a grounding mechanism for testing each electrical wiring harnesses and use input data to analyze each electrical wiring harnesses.

In some embodiments, the controlling method uses a central computer system to access a plurality of electrical wiring harnesses, the testing criteria, and a WHAMS. The controlling method generates a test plan for the plurality of electrical wiring harnesses based on the testing criteria and elect a plurality of wireless test modules using the test plan and the WHAMS. The controlling method generates a plurality of test instructions based on the test plan and the plurality of wireless test modules. The controlling method uses the plurality of wireless test modules to perform one or more tests on the plurality of electrical wiring harnesses according to the plurality of test instructions. The controlling method uses the plurality of wireless test modules to wirelessly communicate test results to the central computer system 130 for display. Furthermore, the controlling method may be used to wirelessly communicate with the plurality of wireless test modules to update a software package and/or one or more smart test adaptors associated with each of the plurality of wireless test modules using part numbers and pin configuration data of the one or more smart test adaptors.

Figure 18A:
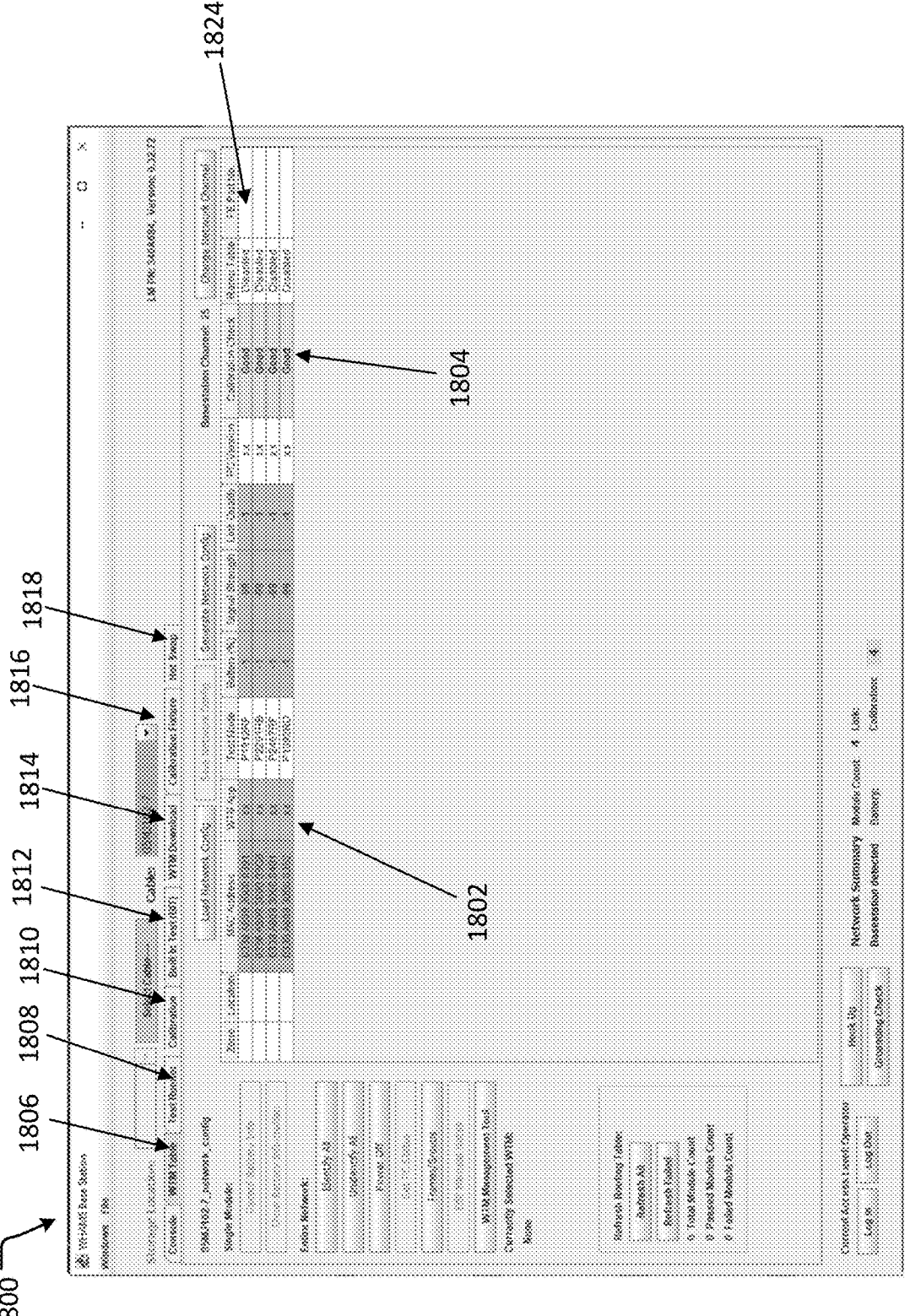
FIGS. 18A and 18B illustrate example application interfaces of operating software for testing of a plurality of electrical wiring harnesses by the wireless harness automated measurement system of FIG. 1, according to particular embodiments.
Figure 18B:
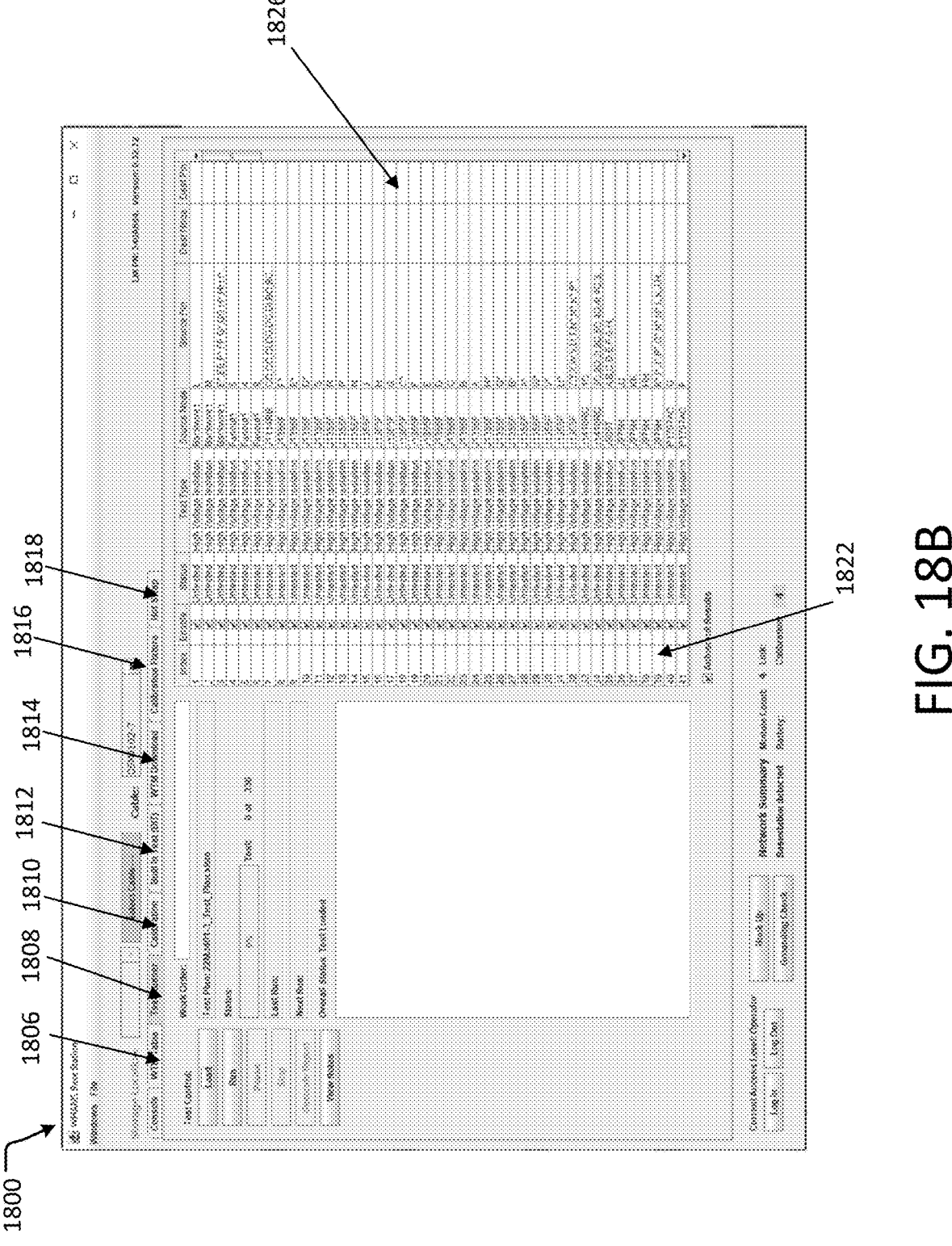

In some embodiments, the application interfaces 1800 illustrated in FIGS. 18A and 18B include a first user interface 1806 for test plan generation. First user interface 1806 may be implemented to define multiple harness features and monitor the creation of the test plan, send alerts of potential errors in conversion.

In some embodiments, application interfaces 1800 include a second user interface 1808 for execution of test plans. Second user interface 1808 may be implemented for a user to visually inspect status of an electronic wiring harness through color coded reporting. For example, a passing test is highlighted in a green color and a failing test is highlighted in a different color, such as red, orange, or yellow, based on a condition of the failure of the failing test. In particular, the user may interact with second user interface 1808 to manage the one or more tests on the plurality of electrical wiring harnesses based on various criteria, such as source and destination reference designators involved, test status, test type, etc. As a result, second user interface 1808 provides a flexible solution to execute a test plan based on various testing conditions. After execution of the test plan, second user interface 1808 generates a final consumable report which is digitally stored and post-processed to extract the data for further utilization in troubleshooting or data analytics.

In some embodiments, application interfaces 1800 include a third user interface 1810 for calibration of the plurality of wireless test modules. Third user interface 1810 may be implemented for a user to control calibration hardware of the WHAMS and automatically calibrate the plurality of the wireless test modules of the WHAMS. Thus, third user interface 1810 may be applied to validate internal relays and their compensation values of the plurality of wireless test modules.

In some embodiments, application interfaces 1800 include a fourth user interface 1812 for built in test (BIT) calibration. Fourth user interface 1812 may be implemented for calibration of test types and module capabilities. For example, fourth interface 1812 may be implemented to check the health of the plurality of the wireless test modules of the WHAMS. As another example, fourth interface 1812 may implemented for a user to define parameters to increase module efficiency and establish a proper voltage for a wireless test module to conduct one or more tests, such as high and low voltage continuity, voltage isolation checks, data bus polarity and diode polarity checks, and resistance measurement checks, etc.

In some embodiments, application interfaces 1800 include a fifth user interface 1814 for module software maintenance and updating. Fifth user interface 1814 may be implemented for a user to wirelessly update one or more software packages on the plurality of wireless test modules. Fifth user interface 1814 may be applied to facilitate an easy transition of new capabilities to the floor with minimal touch labor.

In some embodiments, application interfaces 1800 include a sixth user interface 1816 for test debugging and general module troubleshooting. Sixth user interface 1816 may be implemented to build one-off tests to either troubleshoot an electronic wiring harness or troubleshoot module functionality. The one-off tests may be created based on data of a selected electronic wiring harness by changing a plurality of parameters of the one-off tests for better performance.

In some embodiments, the application interfaces 1800 may include a seventh user interface 1816 for test debugging and general module troubleshooting. Seventh user interface 1816 may be implemented to build one-off tests to either troubleshoot an electronic wiring harness or troubleshoot module functionality. The one-off tests may be created based on data of a selected electronic wiring harness by changing a plurality of parameters of the one-off tests for better performance.

In some embodiments, the application interfaces 1800 include an eighth user interface 1818 to program smart test adaptors, such as hot-swap front ends, with their respective part numbers and pins configuration data. Once programed, eighth user interface 1818 may be implemented to identify a front end connected to a respective wireless test module and relay that information back to application interfaces 1800. As a result, eighth user interface 1818 may be implemented to dynamically build module networks to monitor harness testing based on connectors attached to the respective wireless test module.

FIGS. 18A and 18B illustrate example application interfaces 1800 of an operating software for testing of a plurality of electrical wiring harnesses by the wireless harness automated measurement system of FIG. 1, according to particular embodiments. The wireless harness automated measurement system includes a plurality of wireless test modules. Each of the plurality of wireless test modules is connected to a respective electronic wiring harness for testing. FIG. 18A shows a first test plan of calibration check on a first table 1824 for a first plurality of wireless test modules 1802. In particular, the first test plan is generated to evaluate a status 1804 of the test results through color coded reporting. For example, a passing test is highlighted green and a failing test is highlighted red, orange, or yellow based on a condition of the failing test.

FIG. 18B shows a second test plan of high voltage isolation on a second table 1826 for a second plurality of wireless test modules 1822. The controlling method may automatically build a map of the plurality of electrical wiring harnesses for testing. The controlling method may determine one or more connections available to each of the plurality of second plurality of wireless test modules 1822. As a result, the controlling method may systematically build a plurality of tests to verify isolation or continuity of those connections for each of the plurality of second plurality of wireless test modules 1822. For example, the controlling method may generate a plurality of continuity tests for each of the plurality of electrical wiring harnesses. The controlling method may validate source and destination reference designators are assigned to a wireless test module. As another example, the controlling method may generate isolation checks for each of the plurality of electrical wiring harnesses. Likewise, the second test plan is applied to check on all supposedly unused pins of electrical connectors of the plurality of electrical wiring harnesses to ensure there are no harness shorts or miss wires.

In some embodiments, application interfaces 1800 may be used to call for an additional module to increase a plurality of possible routes to create a grounded circuit for testing. In particular, the controlling method may be used to perform one or more electrical tests on the plurality of electrical wiring harness, such as high and low voltage continuity, voltage isolation checks, data bus polarity and diode polarity checks, and resistance measurement checks, etc. Thus, the controlling method can use application interfaces 1800 for a user to monitor a health status and a functionality status for the plurality of wireless test modules of the WHAMS. In particular, the controlling method may determine testing conditions of the WHAMS based on the health status and the functionality status for the plurality of wireless test modules. Likewise, the controlling method may choose a plurality of actions for planning the testing of the plurality of electronical wiring harnesses, such as module identification, power off, and harness hookup. The controlling method may allow for whole scale network changes, such as operational wireless channel and loading of different harnesses for different tests.

Figure 19:
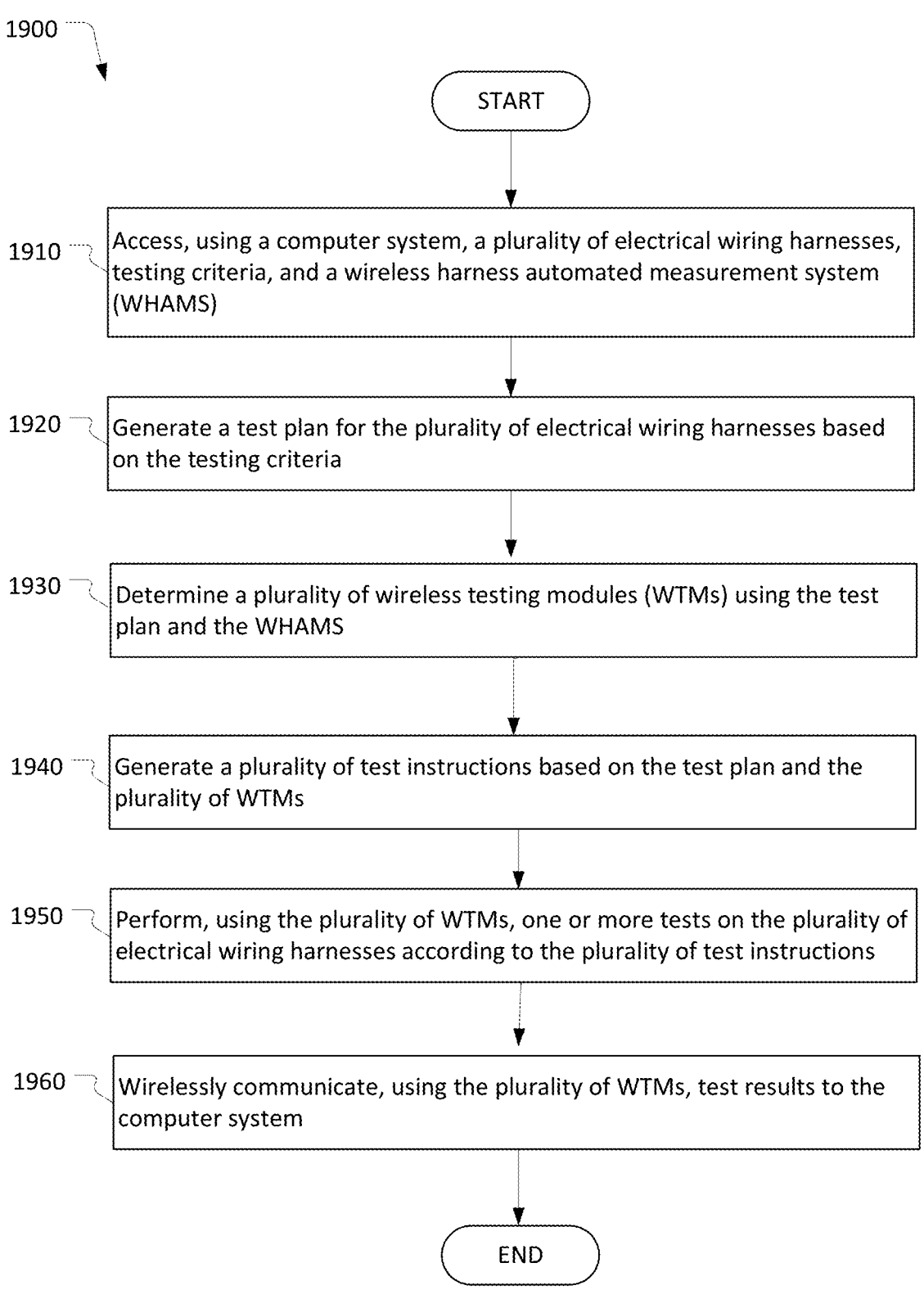
FIG. 19 illustrates a flow diagram illustrating an example method for testing of a wireless test module, according to particular embodiments.

FIG. 19 is a flow diagram illustrating an example method 1900 for testing of a wireless test module, according to particular embodiments. Method 1900 may begin at step 1910 where a plurality of electrical wiring harnesses, testing criteria, and a wireless harness automated measurement system (WHAMS) are accessed by using a computer server. In some embodiments, the WHAMS include a plurality of wireless test modules. In some embodiments, each of the plurality of electrical wiring harnesses is connected to a respective wireless test module of the WHAMS.

At step 1920, a test plan is generated for the plurality of electrical wiring harnesses. For example, the test plan may include one or more electrical tests on the plurality of electrical wiring harnesses (e.g., continuity checks, voltage isolation checks, diode polarity checks, resistance measurement checks, etc.). As another example, the test plan includes a map of the plurality of electrical wiring harnesses, a plurality of harness connections associated with each of the plurality of wireless test modules.

At step 1930, a plurality of wireless testing modules (WTMs) are determined using the test plan and the WHAMS. For example, the plurality of wireless test modules are selected based on various testing conditions. As another example, the plurality of wireless test modules are properly calibrated using a calibration fixture.

At step 1940, a plurality of test instructions are generated based on the test plan and the plurality of wireless testing modules. In some embodiments, each of the plurality of wireless test modules is operable to wirelessly receive one or more of the plurality of test instructions from the computer system. The plurality of test instructions are one or more signals, operations, commands, and the like.

At step 1950, one or more tests are performed using the plurality of wireless test modules on the plurality of electrical wiring harnesses according to the plurality of test instructions. Upon receiving the plurality of test instructions, the plurality of wireless test modules are configured to automatically perform the one or more electrical tests on the plurality of electrical wiring harnesses (e.g., continuity checks, voltage isolation checks, diode polarity checks, resistance measurement checks, etc.).

At step 1960, test results are sent to the computer system by wirelessly communicating with the computer system using the plurality of WTMs. In some embodiments, test results are collected by the computer system for the one or more electrical tests and displayed on a user interface for a user to visually inspect status of the plurality of electronic wiring harnesses through color coded reporting. For example, a passing test is highlighted in a green color and a failing test is highlighted in a different color, such as red, orange, or yellow, based on a condition of the failure of the failing test. After step 1960, method 1900 may end.

Figure 20:
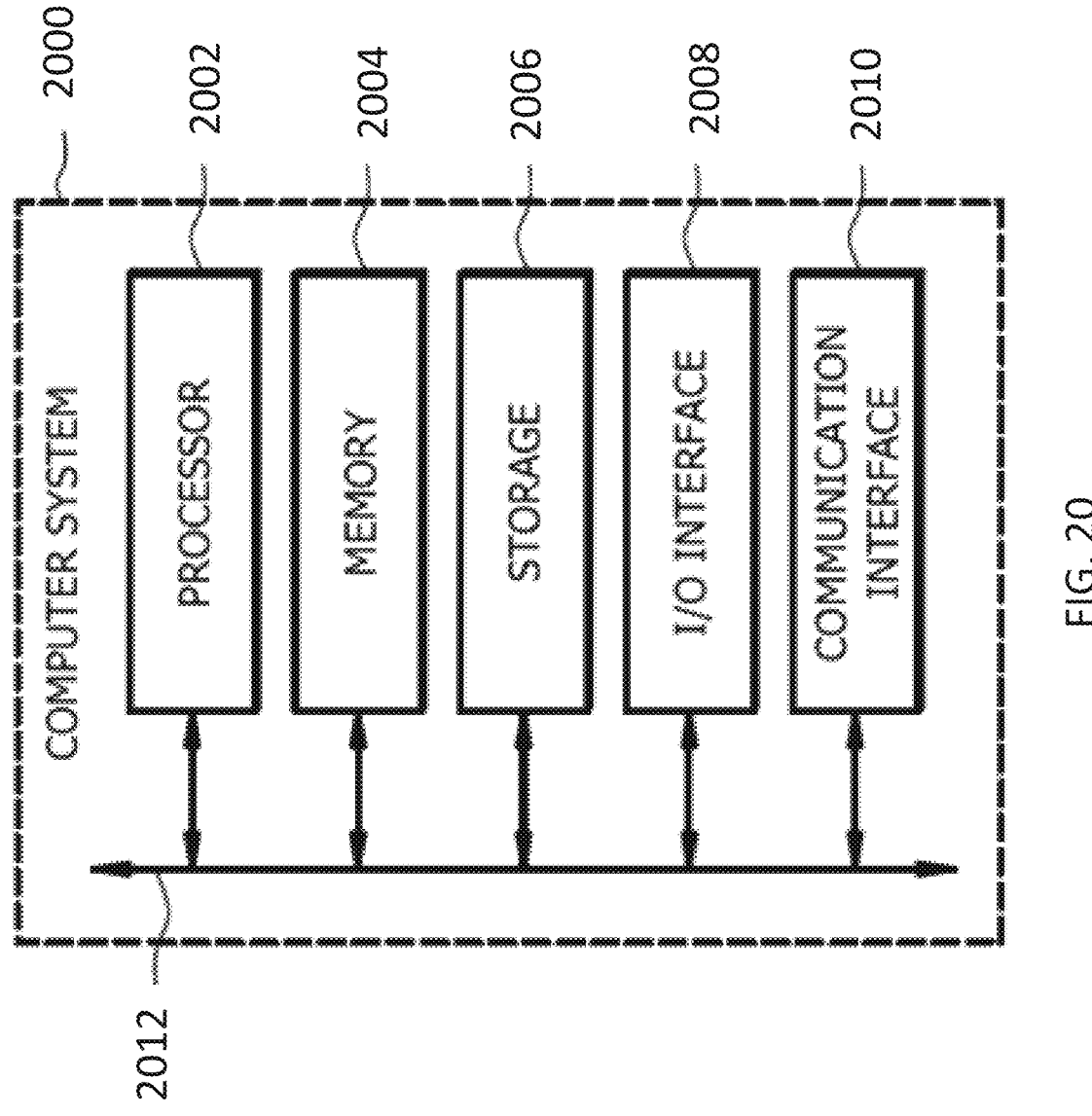
FIG. 20 illustrates an example computer system that can be utilized to implement aspects of the various technologies presented herein, according to particular embodiments.

FIG. 20 illustrates an example computer system 2000. In particular embodiments, one or more computer systems 2000 perform one or more steps of one or more methods described or illustrated herein. In particular embodiments, one or more computer systems 2000 provide functionality described or illustrated herein. In particular embodiments, software running on one or more computer systems 2000 performs one or more steps of one or more methods described or illustrated herein or provides functionality described or illustrated herein. Particular embodiments include one or more portions of one or more computer systems 2000. Herein, reference to a computer system may encompass a computing device, and vice versa, where appropriate. Moreover, reference to a computer system may encompass one or more computer systems, where appropriate.

This disclosure contemplates any suitable number of computer systems 2000. This disclosure contemplates computer system 2000 taking any suitable physical form. As example and not by way of limitation, computer system 2000 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, an augmented/virtual reality device, or a combination of two or more of these. Where appropriate, computer system 2000 may include one or more computer systems 2000; be unitary or distributed; span multiple locations; span multiple machines; span multiple data centers; or reside in a cloud, which may include one or more cloud components in one or more networks. Where appropriate, one or more computer systems 2000 may perform without substantial spatial or temporal limitation one or more steps of one or more methods described or illustrated herein. As an example and not by way of limitation, one or more computer systems 2000 may perform in real time or in batch mode one or more steps of one or more methods described or illustrated herein. One or more computer systems 2000 may perform at different times or at different locations one or more steps of one or more methods described or illustrated herein, where appropriate.

In particular embodiments, computer system 2000 includes a processor 2002, memory 2004, storage 2006, an input/output (I/O) interface 2008, a communication interface 2010, and a bus 2012. Although this disclosure describes and illustrates a particular computer system having a particular number of particular components in a particular arrangement, this disclosure contemplates any suitable computer system having any suitable number of any suitable components in any suitable arrangement.

In particular embodiments, processor 2002 includes hardware for executing instructions, such as those making up a computer program. As an example and not by way of limitation, to execute instructions, processor 2002 may retrieve (or fetch) the instructions from an internal register, an internal cache, memory 2004, or storage 2006; decode and execute them; and then write one or more results to an internal register, an internal cache, memory 2004, or storage 2006. In particular embodiments, processor 2002 may include one or more internal caches for data, instructions, or addresses. This disclosure contemplates processor 2002 including any suitable number of any suitable internal caches, where appropriate. As an example and not by way of limitation, processor 2002 may include one or more instruction caches, one or more data caches, and one or more translation lookaside buffers (TLBs). Instructions in the instruction caches may be copies of instructions in memory 2004 or storage 2006, and the instruction caches may speed up retrieval of those instructions by processor 2002. Data in the data caches may be copies of data in memory 2004 or storage 2006 for instructions executing at processor 2002 to operate on; the results of previous instructions executed at processor 2002 for access by subsequent instructions executing at processor 2002 or for writing to memory 2004 or storage 2006; or other suitable data. The data caches may speed up read or write operations by processor 2002. The TLBs may speed up virtual-address translation for processor 2002. In particular embodiments, processor 2002 may include one or more internal registers for data, instructions, or addresses. This disclosure contemplates processor 2002 including any suitable number of any suitable internal registers, where appropriate. Where appropriate, processor 2002 may include one or more arithmetic logic units (ALUs); be a multi-core processor; or include one or more processors 2002. Although this disclosure describes and illustrates a particular processor, this disclosure contemplates any suitable processor.

In particular embodiments, memory 2004 includes main memory for storing instructions for processor 2002 to execute or data for processor 2002 to operate on. As an example and not by way of limitation, computer system 2000 may load instructions from storage 2006 or another source (such as, for example, another computer system 2000) to memory 2004. Processor 2002 may then load the instructions from memory 2004 to an internal register or internal cache. To execute the instructions, processor 2002 may retrieve the instructions from the internal register or internal cache and decode them. During or after execution of the instructions, processor 2002 may write one or more results (which may be intermediate or final results) to the internal register or internal cache. Processor 2002 may then write one or more of those results to memory 2004. In particular embodiments, processor 2002 executes only instructions in one or more internal registers or internal caches or in memory 2004 (as opposed to storage 2006 or elsewhere) and operates only on data in one or more internal registers or internal caches or in memory 2004 (as opposed to storage 2006 or elsewhere). One or more memory buses (which may each include an address bus and a data bus) may couple processor 2002 to memory 2004. Bus 2012 may include one or more memory buses, as described below. In particular embodiments, one or more memory management units (MMUs) reside between processor 2002 and memory 2004 and facilitate accesses to memory 2004 requested by processor 2002. In particular embodiments, memory 2004 includes random access memory (RAM). This RAM may be volatile memory, where appropriate. Where appropriate, this RAM may be dynamic RAM (DRAM) or static RAM (SRAM). Moreover, where appropriate, this RAM may be single-ported or multi-ported RAM. This disclosure contemplates any suitable RAM. Memory 2004 may include one or more memories 2004, where appropriate. Although this disclosure describes and illustrates particular memory, this disclosure contemplates any suitable memory.

In particular embodiments, storage 2006 includes mass storage for data or instructions. As an example and not by way of limitation, storage 2006 may include a hard disk drive (HDD), a floppy disk drive, flash memory, an optical disc, a magneto-optical disc, magnetic tape, or a Universal Serial Bus (USB) drive or a combination of two or more of these. Storage 2006 may include removable or non-removable (or fixed) media, where appropriate. Storage 2006 may be internal or external to computer system 2000, where appropriate. In particular embodiments, storage 2006 is non-volatile, solid-state memory. In particular embodiments, storage 2006 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 2006 taking any suitable physical form. Storage 2006 may include one or more storage control units facilitating communication between processor 2002 and storage 2006, where appropriate. Where appropriate, storage 2006 may include one or more storages 2006. Although this disclosure describes and illustrates particular storage, this disclosure contemplates any suitable storage.

In particular embodiments, I/O interface 2008 includes hardware, software, or both, providing one or more interfaces for communication between computer system 2000 and one or more I/O devices. Computer system 2000 may include one or more of these I/O devices, where appropriate. One or more of these I/O devices may enable communication between a person and computer system 2000. As an example and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 2008 for them. Where appropriate, I/O interface 2008 may include one or more device or software drivers enabling processor 2002 to drive one or more of these I/O devices. I/O interface 2008 may include one or more I/O interfaces 2008, where appropriate. Although this disclosure describes and illustrates a particular I/O interface, this disclosure contemplates any suitable I/O interface.

In particular embodiments, communication interface 2010 includes hardware, software, or both providing one or more interfaces for communication (such as, for example, wireless communications) between computer system 2000 and one or more other devices or system. As an example and not by way of limitation, communication interface 2010 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 2010 for it. As an example and not by way of limitation, computer system 2000 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, computer system 2000 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network, a Long-Term Evolution (LTE) network, or a 5G network), or other suitable wireless network or a combination of two or more of these. Computer system 2000 may include any suitable communication interface 2010 for any of these networks, where appropriate. Communication interface 2010 may include one or more communication interfaces 2010, where appropriate. Although this disclosure describes and illustrates a particular communication interface, this disclosure contemplates any suitable communication interface.

In particular embodiments, bus 2012 includes hardware, software, or both coupling components of computer system 2000 to each other. As an example and not by way of limitation, bus 2012 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 2012 may include one or more buses 2012, where appropriate. Although this disclosure describes and illustrates a particular bus, this disclosure contemplates any suitable bus or interconnect.

Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both,"

unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

The embodiments disclosed herein are only examples, and the scope of this disclosure is not limited to them. Particular embodiments may include all, some, or none of the components, elements, features, functions, operations, or steps of the embodiments disclosed herein. Certain embodiments are in particular disclosed in the attached claims directed to a method, a storage medium, a system and a computer program product, wherein any feature mentioned in one claim category, e.g. method, can be claimed in another claim category, e.g. system, as well. The dependencies or references back in the attached claims are chosen for formal reasons only. However, any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter which can be claimed includes not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

What is claimed is:

1. A system comprising:
a computer system; and
a plurality of wireless test modules, each wireless test module operable to physically couple to an electrical wiring harness using a removable front end, the removable front end comprising an electrical connector configured to mate to an electrical connector of the electrical wiring harness, each wireless test module comprising a wireless transceiver;

wherein the computer system is operable to send a plurality of test instructions to the plurality of wireless test modules according to an automated test plan; and wherein each wireless test module is operable to:

wirelessly receive one or more of the plurality of test instructions from the computer system using the wireless transceiver;

perform one or more tests on the electrical wiring harness according to received one or more test instructions from the computer system; and wirelessly communicate test results to the computer system using the wireless transceiver.

2. The system of claim 1, wherein the one or more tests are selected from a plurality of tests comprising:

a continuity check (pins in wrong spot/shorted pins);

a voltage isolation check;

a diode polarity check; and a resistance measurement check.

3. The system of claim 1, wherein the computer system and the plurality of wireless test modules wirelessly communicate using WI-FI, Bluetooth, or Zigbee.

4. The system of claim 1, wherein:

the plurality of wireless test modules includes a source wireless test module and a destination test module;

the source wireless test module is coupled to a first connector of the electrical wiring harness;

the destination wireless test module is coupled to a second connector of the electrical wiring harness; and the one or more tests performed on the electrical wiring harness includes utilizing two electrical wires of the electrical wiring harness that are electrically coupled to both the source test module and the destination test module, the two electrical wires comprising:

a first electrical wire under test; and a second electrical wire used for a ground.

5. The system of claim 1, wherein each wireless test module includes a plurality of electrical relays.

6. The system of claim 1, wherein each wireless test module includes a rechargeable battery.

7. The system of claim 1, wherein each wireless test module is cylindrical in shape.

8. The system of claim 1, wherein each wireless test module is operable to vary a plurality of outputs according to the received one or more test instructions from the computer system, the plurality of outputs comprising a voltage and an electrical current.

9. The system of claim 1, wherein the computer system is operable to display the test results received from the plurality of wireless test modules on an electronic display.

10. The system of claim 1, wherein:

the plurality of wireless test modules includes a first wireless test module and a second test module;

the first wireless test module includes a first removable front end, the first removable front end comprising a first electrical connector configured to mate to a first electrical connector of the electrical wiring harness; and the second wireless test module includes a second removable front end, the second removable front end comprising a second electrical connector configured to mate to a second electrical connector of the electrical wiring harness, the first electrical connector of the electrical wiring harness being a different type of connector from the second electrical connector of the electrical wiring harness.

11. A system comprising:

a computer system; and a wireless test module operable to physically couple to an electrical wiring harness using a removable front end, the removable front end comprising an electrical connector configured to mate to an electrical connector of the electrical wiring harness, the wireless test module comprising a wireless transceiver;

wherein the computer system is operable to send a plurality of test instructions to the wireless test module according to an automated test plan; and wherein the wireless test module is operable to:

wirelessly receive one or more of the plurality of test instructions from the computer system using the wireless transceiver;

perform one or more tests on the electrical wiring harness according to received one or more test instructions from the computer system; and wirelessly communicate test results to the computer system using the wireless transceiver.

12. The system of claim 11, wherein the one or more tests are selected from a plurality of tests comprising:

a continuity check;

a voltage isolation check;

a diode polarity check; and a resistance measurement check.

13. The system of claim 11, wherein the computer system and the wireless test module wirelessly communicate using WI-FI, Bluetooth, or Zigbee.

14. The system of claim 11, wherein the wireless test module includes a plurality of electrical relays.

15. The system of claim 11, wherein the wireless test module includes a rechargeable battery.

16. The system of claim 11, the wireless test module is cylindrical in shape.

17. The system of claim 11, wherein the wireless test module is operable to vary a plurality of outputs according to the received one or more test instructions from the computer system, the plurality of outputs comprising a voltage and an electrical current.

18. The system of claim 11, wherein the computer system is operable to display the test results received from the plurality of wireless test modules on an electronic display.

* * * * *